(12) United States Patent
Ikura et al.

(10) Patent No.: US 8,065,793 B2
(45) Date of Patent: Nov. 29, 2011

(54) METHOD OF ENCAPSULATING AN ELECTRONIC COMPONENT

(75) Inventors: Kazuyuki Ikura, Kawasaki (JP); Junzou Une, Kawasaki (JP); Jun Matsueda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/617,076

(22) Filed: Nov. 12, 2009

(65) Prior Publication Data
US 2010/0122457 A1    May 20, 2010

(30) Foreign Application Priority Data
Nov. 19, 2008   (JP) .................................. 2008-295496

(51) Int. Cl.
*H05K 3/30*   (2006.01)
(52) U.S. Cl. ................. 29/841; 29/827; 29/832; 29/833; 29/840
(58) Field of Classification Search ............ 29/825, 29/827, 832, 833, 840; 257/679
See application file for complete search history.

(56) References Cited

U.S. PATENT DOCUMENTS

| | | | | |
|---|---|---|---|---|
| 4,222,516 A * | 9/1980 | Badet et al. | .................... | 235/492 |
| 4,709,254 A * | 11/1987 | Haghiri-Tehrani et al. | ... | 257/679 |
| 4,803,542 A * | 2/1989 | Haghiri-Tehrani et al. | ... | 257/679 |
| 5,367,766 A * | 11/1994 | Burns et al. | ..................... | 29/848 |
| 5,416,358 A * | 5/1995 | Ochi et al. | .................... | 257/666 |
| 5,520,863 A * | 5/1996 | Ochi et al. | .................... | 264/46.5 |
| 6,782,612 B2 * | 8/2004 | Chiu | .............................. | 29/840 |

FOREIGN PATENT DOCUMENTS
JP   2000-195882 A    7/2000
* cited by examiner

*Primary Examiner* — Carl Arbes
(74) *Attorney, Agent, or Firm* — Westerman, Hattori, Daniels & Adrian, LLP

(57) ABSTRACT

An application method for resin includes applying resin to a first electronic component in an application chamber under a first internal pressure, moving a second electronic component into an internal pressure adjustment chamber under a second internal pressure which is higher than the first internal pressure and adjusting an internal pressure of the internal pressure adjustment chamber from the second internal pressure to the first internal pressure, and moving the second electronic component into the application chamber while moving the first electronic component into the internal pressure adjustment chamber after the step of application of the resin has been completed.

6 Claims, 21 Drawing Sheets

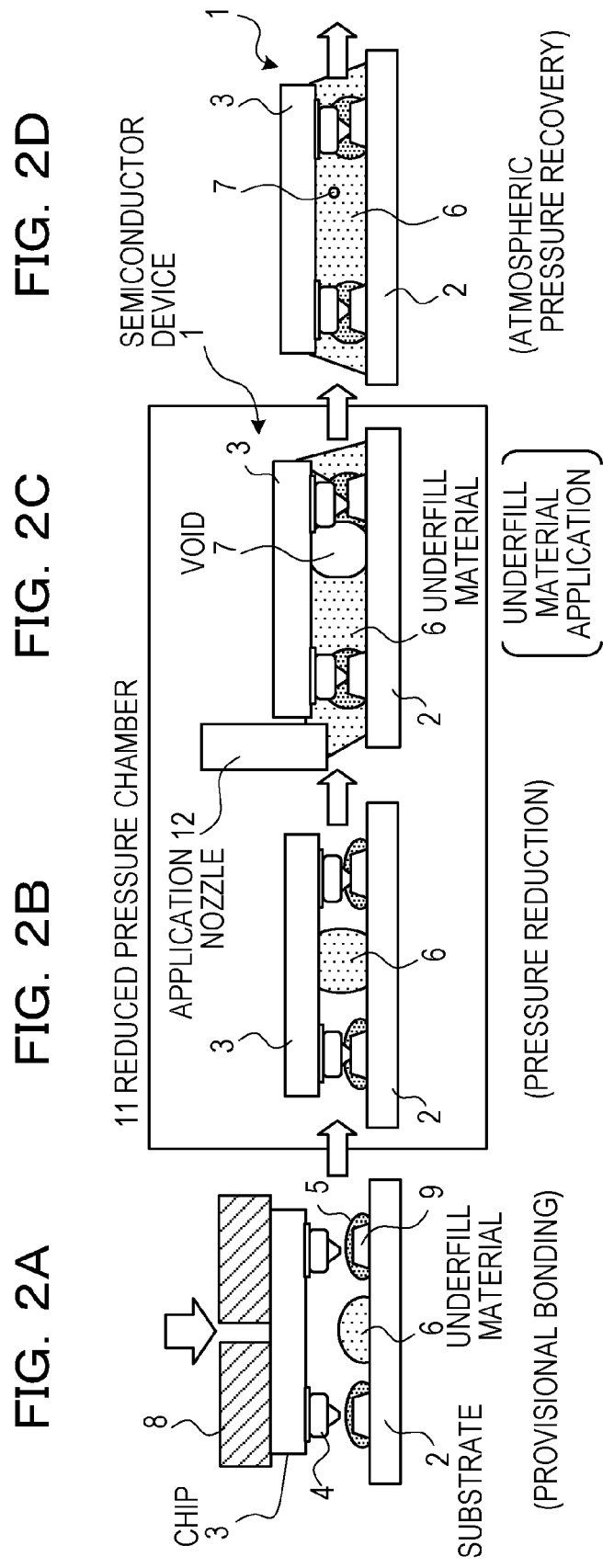

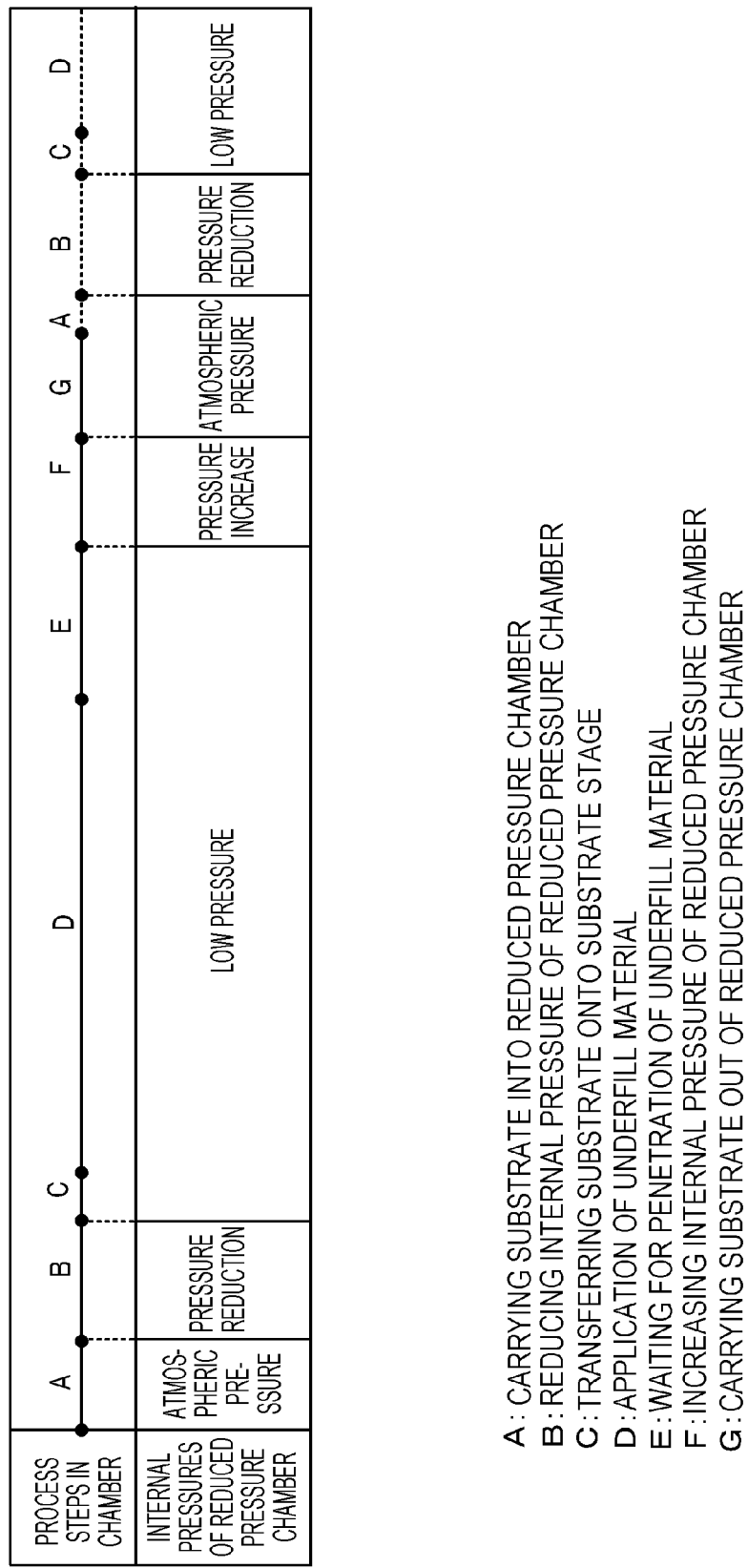

FIG. 4

A: CARRYING SUBSTRATE INTO REDUCED PRESSURE CHAMBER
B: REDUCING INTERNAL PRESSURE OF REDUCED PRESSURE CHAMBER
C: TRANSFERRING SUBSTRATE ONTO SUBSTRATE STAGE
D: APPLICATION OF UNDERFILL MATERIAL
E: WAITING FOR PENETRATION OF UNDERFILL MATERIAL
F: INCREASING INTERNAL PRESSURE OF REDUCED PRESSURE CHAMBER
G: CARRYING SUBSTRATE OUT OF REDUCED PRESSURE CHAMBER

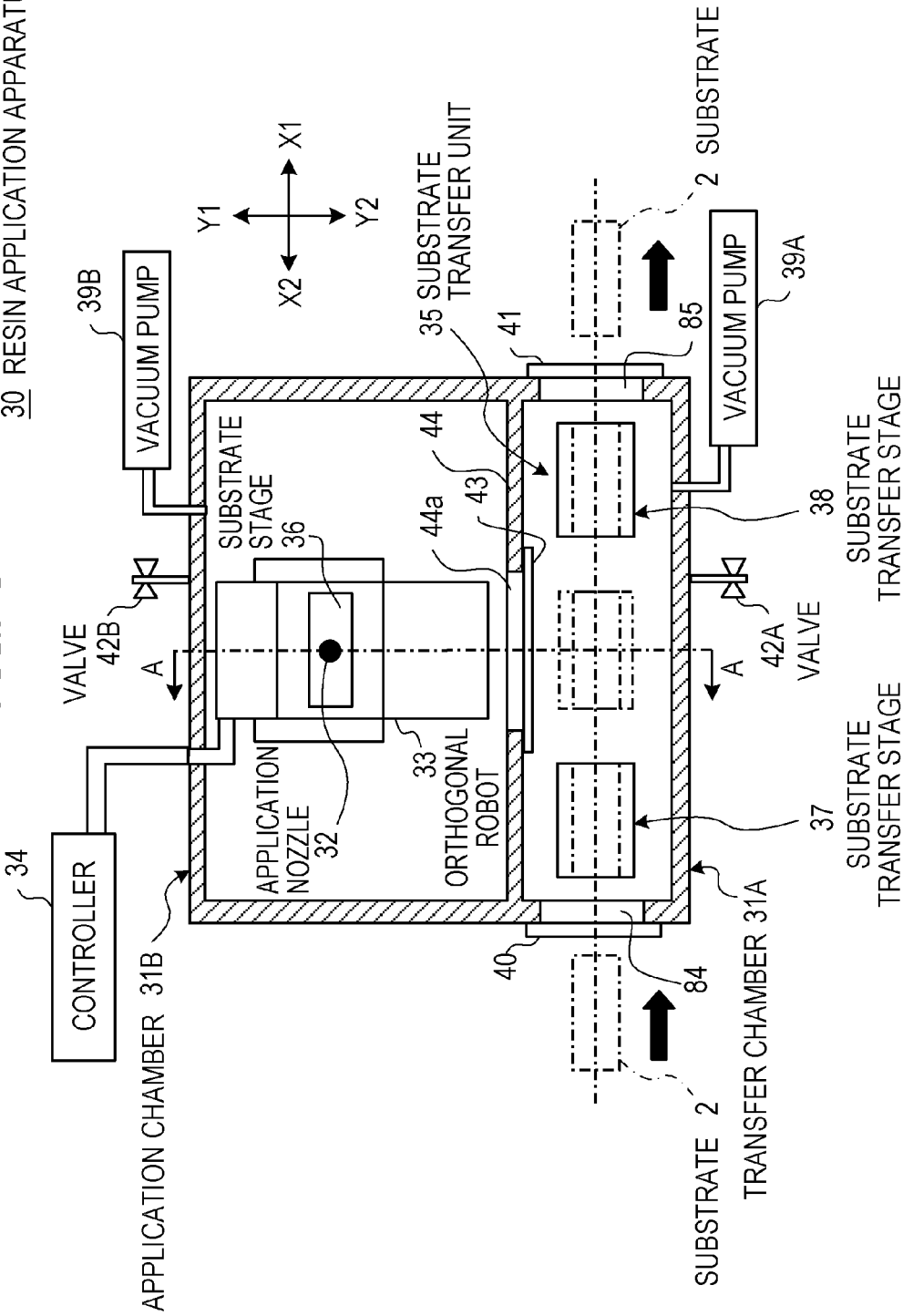

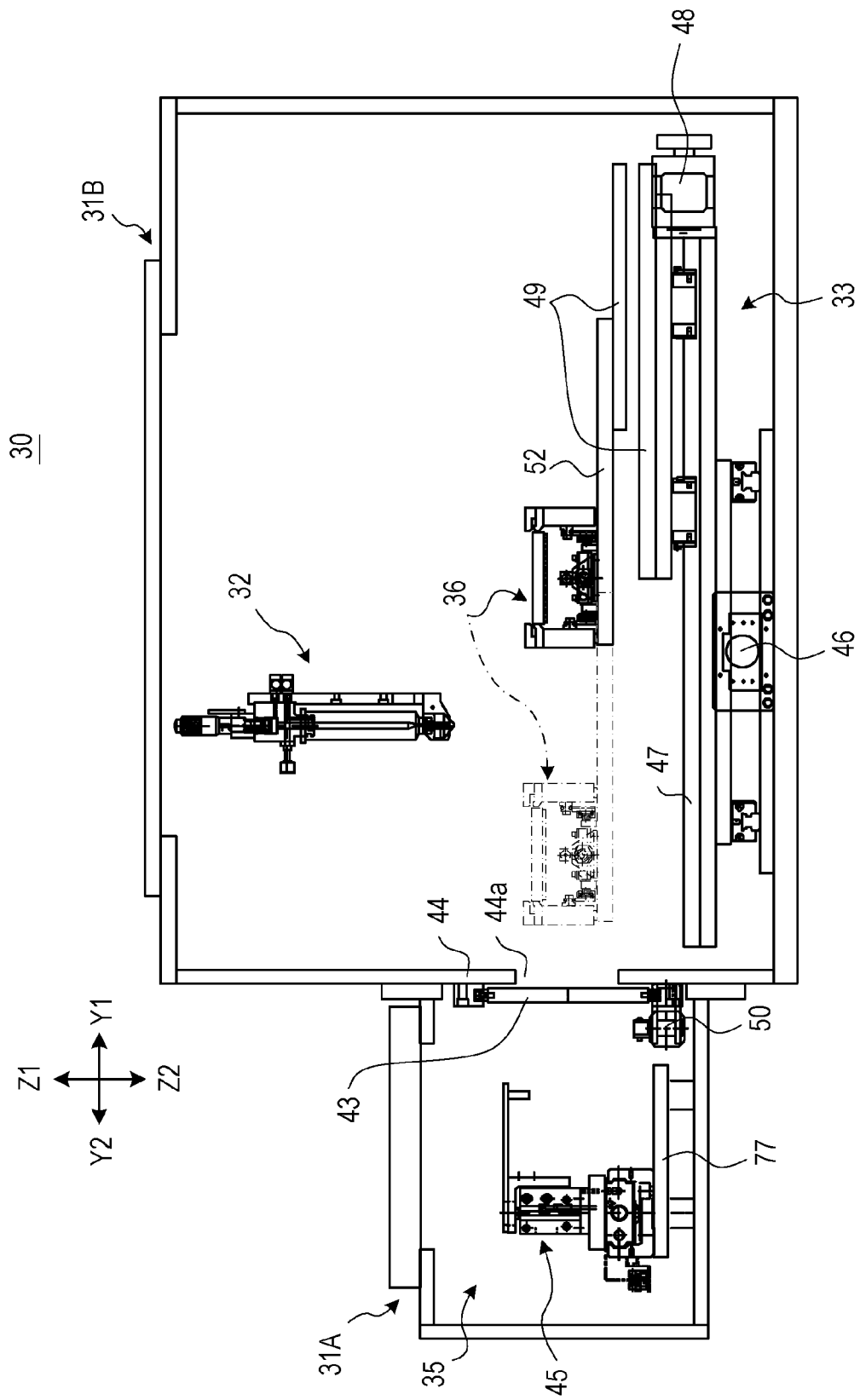

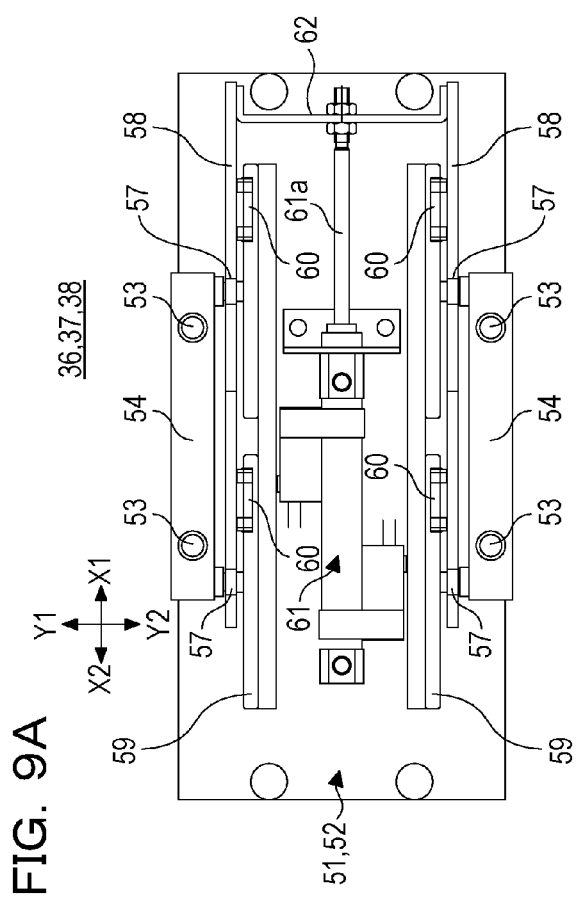
FIG. 9A
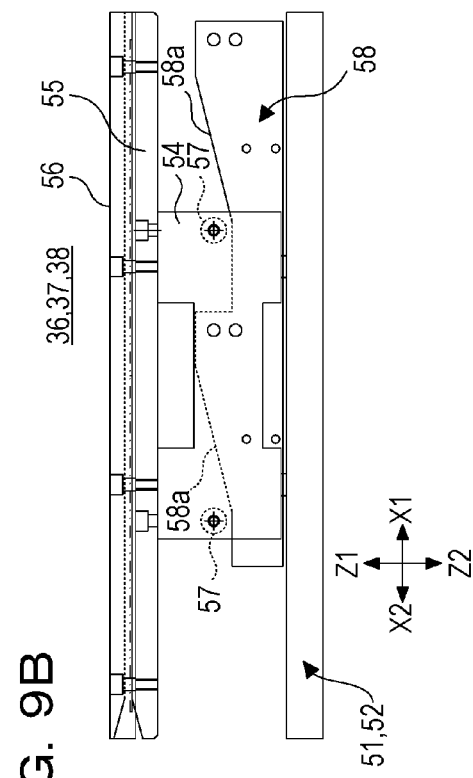
FIG. 9C
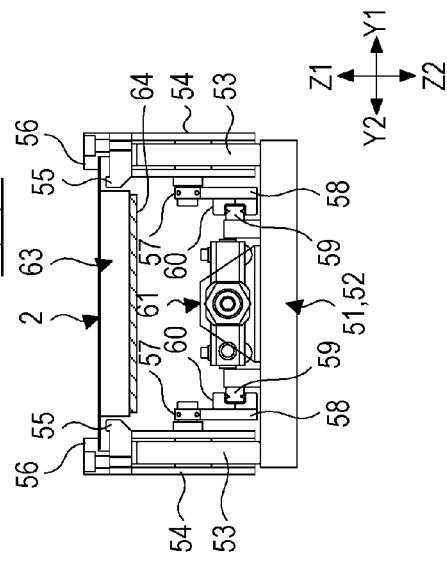
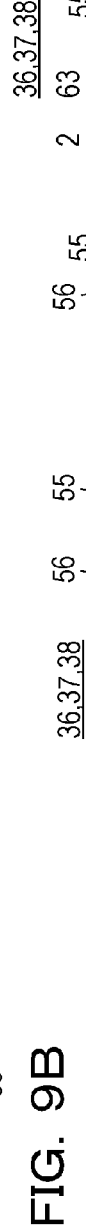
FIG. 9B

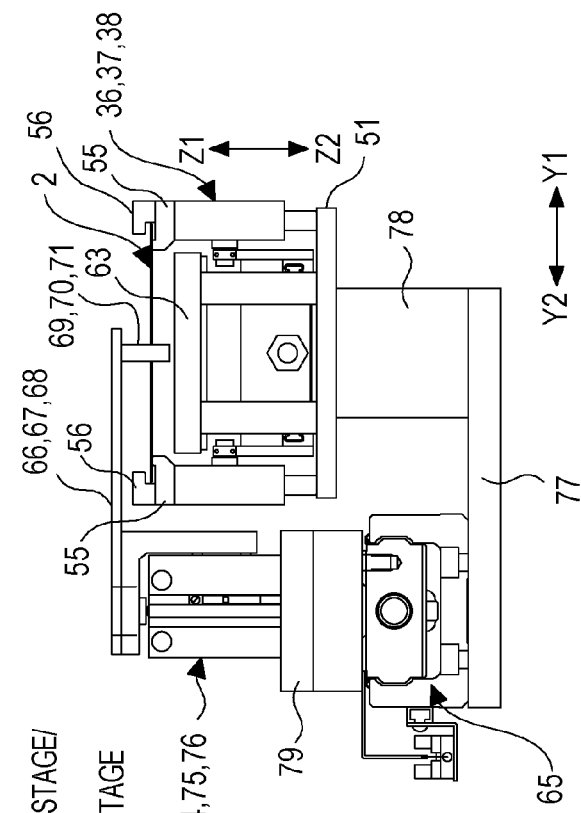
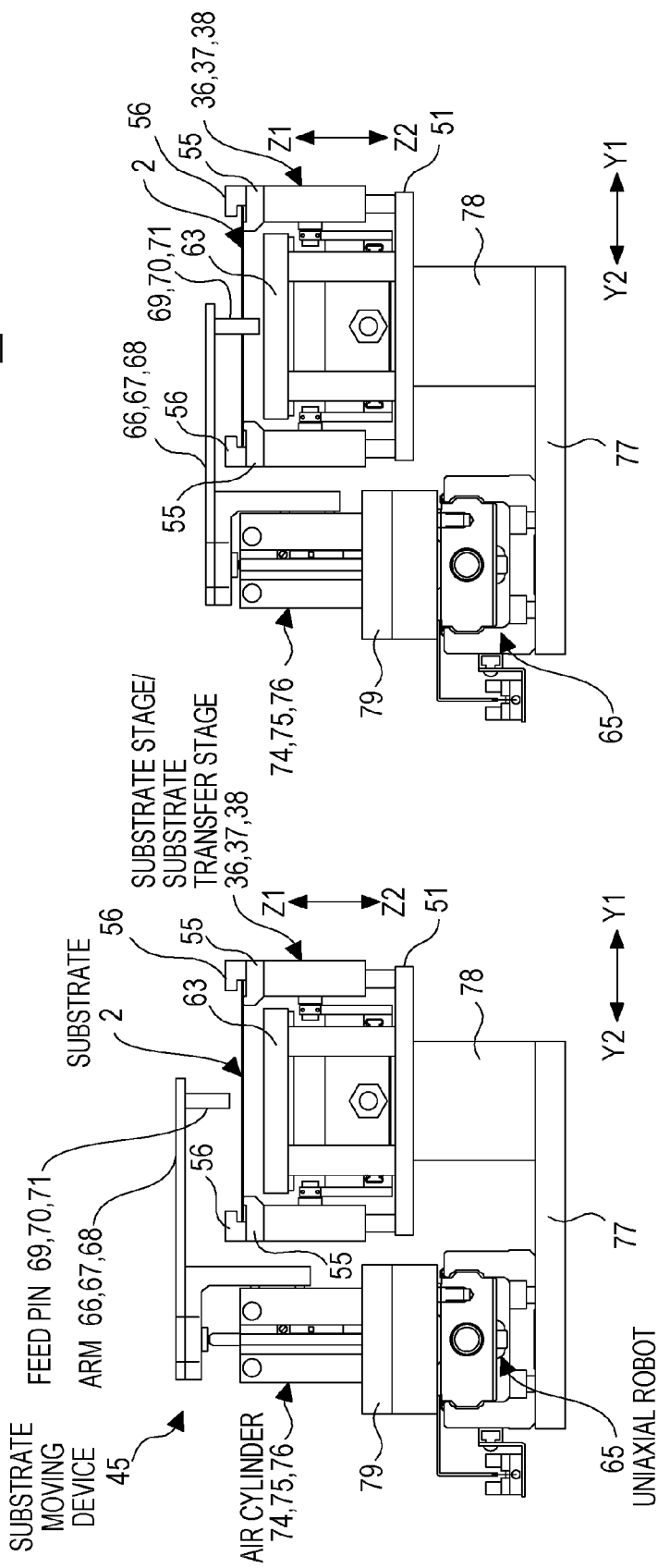

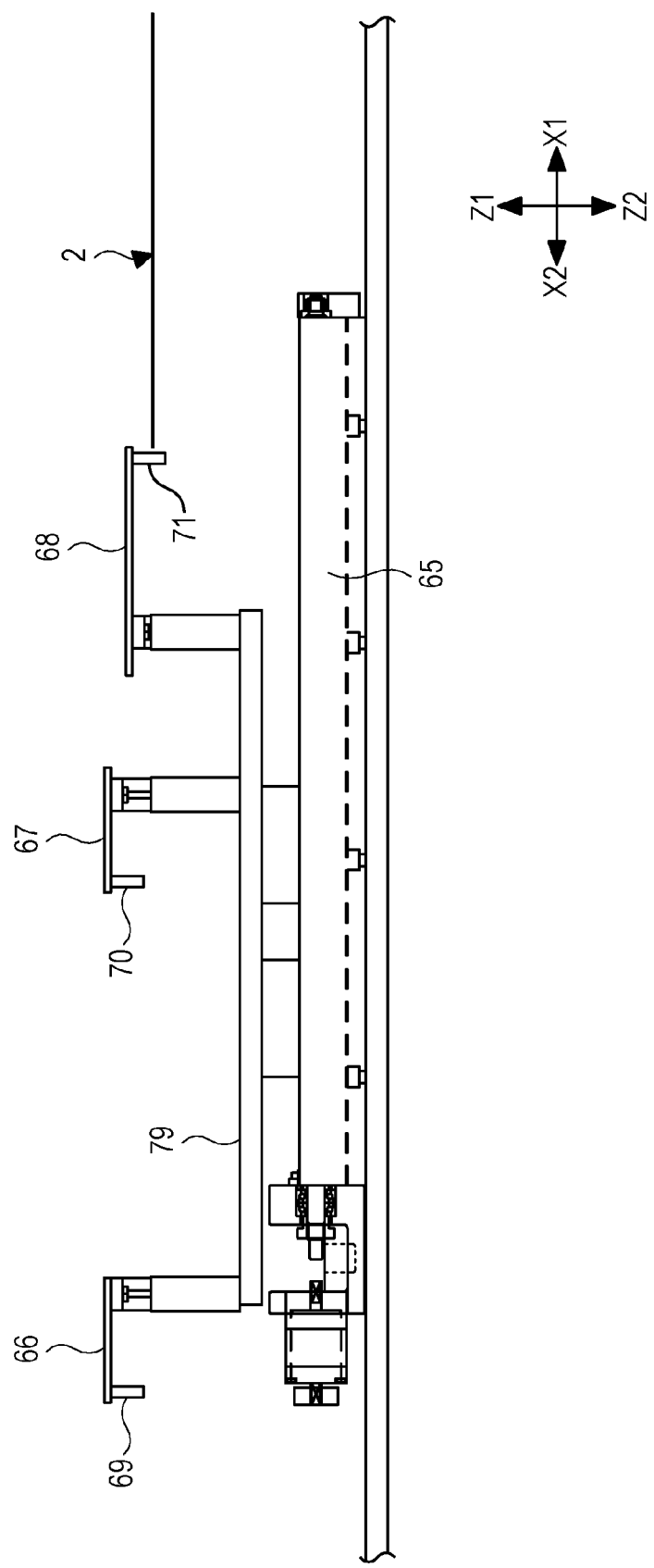

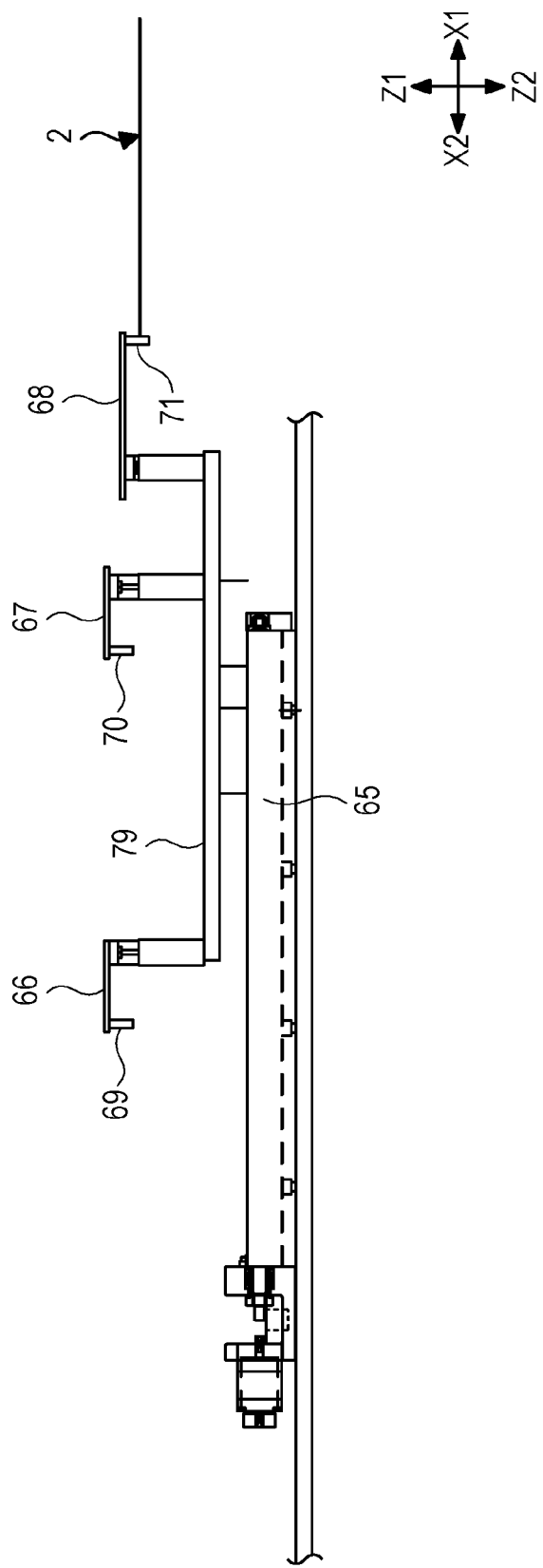

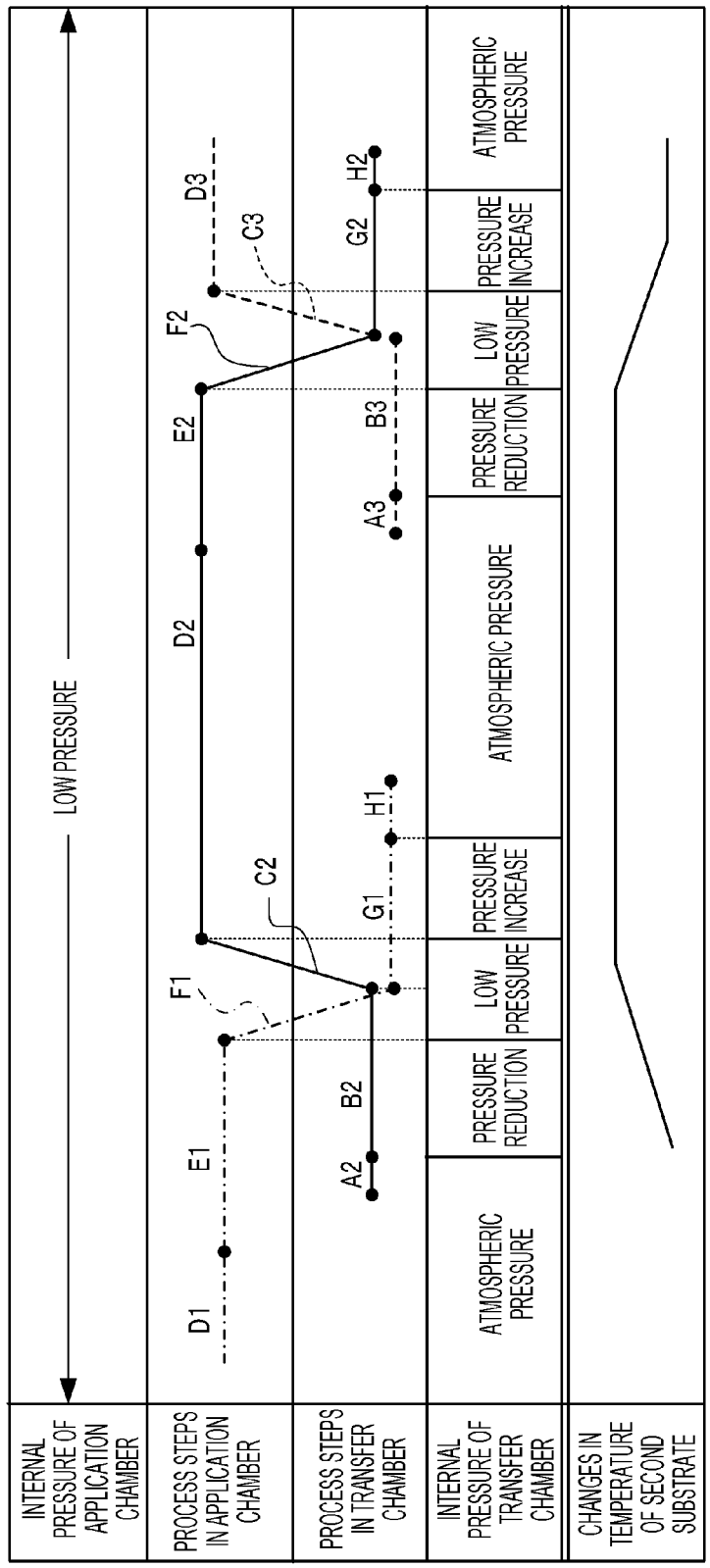

METHOD OF ENCAPSULATING AN ELECTRONIC COMPONENT

CROSS-REFERENCE TO RELATED APPLICATIONS

This application is based upon and claims the benefit of priority of the prior Japanese Patent Application No. 2008-295496, filed on Nov. 19, 2008, the entire contents of which are incorporated herein by reference.

FIELD

The present invention relates to an application method and apparatus for resin.

BACKGROUND

Japanese Laid-open Patent Publication No. 2000-195882 describes a method of applying the underfill material between a substrate and a chip under a low pressure environment as a method of suppressing the generation of an inter bump void in the underfill material.

SUMMARY

According to an aspect of the described embodiments, an application method for resin includes applying resin to a first electronic component in an application chamber under a first internal pressure, moving a second electronic component into an internal pressure adjustment chamber under a second internal pressure which is higher than the first internal pressure and adjusting an internal pressure of the internal pressure adjustment chamber from the second internal pressure to the first internal pressure, and moving the second electronic component into the application chamber while moving the first electronic component into the internal pressure adjustment chamber after the step of application of the resin has been completed.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIGS. 2A to 2D illustrate an underfill material application method which is capable of suppressing the generation of a void;

FIG. 4 illustrates underfill material application steps carried out by the resin application apparatus;

FIG. 5 illustrates a configuration of a resin application apparatus;

FIG. 7 illustrates an application chamber and a transfer chamber which are isolated from each other by a transfer door;

FIGS. 9A to 9C each illustrate a substrate stage/substrate transfer stage in a state in which the hot plate is in a lowered position;

FIG. 12A illustrates a right-hand side of the substrate transfer unit in a standby state;

FIG. 12B illustrates the right-hand side of the substrate transfer unit in a state of transferring a substrate;

FIG. 17 illustrates a front side of a substrate moving device;

FIG. 18 illustrates a front side of a substrate moving device;

FIG. 19 illustrates underfill material application steps carried out by a resin application apparatus;

DESCRIPTION OF EMBODIMENTS

Figure 1A:
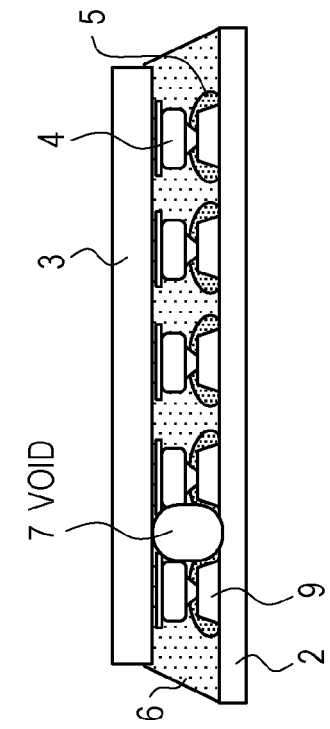
FIGS. 1A and 1B illustrate a void generated in an underfill material used in a semiconductor device.

In cases where a semiconductor chip is mounted on a substrate by flip chip bonding, a sufficient strength may not be ensured only by the bond strength between a bump and an electrode. For this reason, an underfill material is filled between the semiconductor chip and the substrate to enhance the reliability of the device. FIG. 1A illustrates a semiconductor device 1 in which a semiconductor element 3 (hereinafter "chip") is mounted on a substrate 2. Though the semiconductor device illustrated in FIGS. 1A and 1B includes only one chip 3 mounted on the substrate 2, the following description holds true for a semiconductor device including plural chips 3 mounted on the substrate 2.

The chip 3 is provided with bumps 4. The chip 3 is mounted on the substrate 2 by bonding each of the bumps 4 to a respective one of electrode pads 9 of the substrate 2 by means of a bonding material 5. In order to enhance the reliability of connection between the bumps 4 and the respective electrode pads 9, an underfill material 6 is filled between the substrate 2 and the chip 3.

Figure 1B:
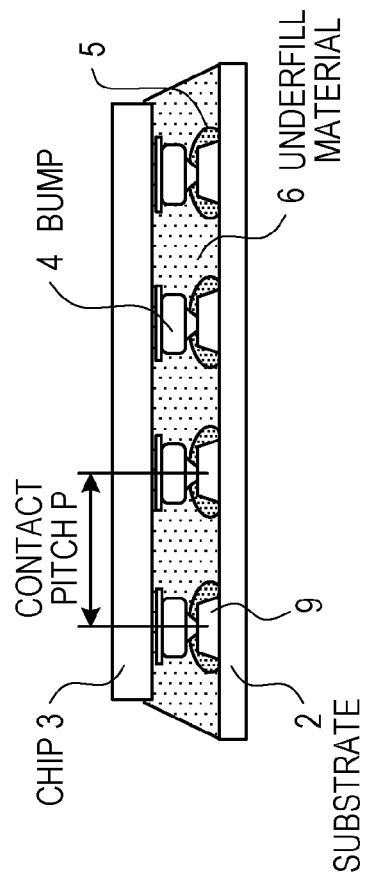

FIG. 1B illustrates a state in which a void 7 is generated between adjacent bumps.

Figure 3:
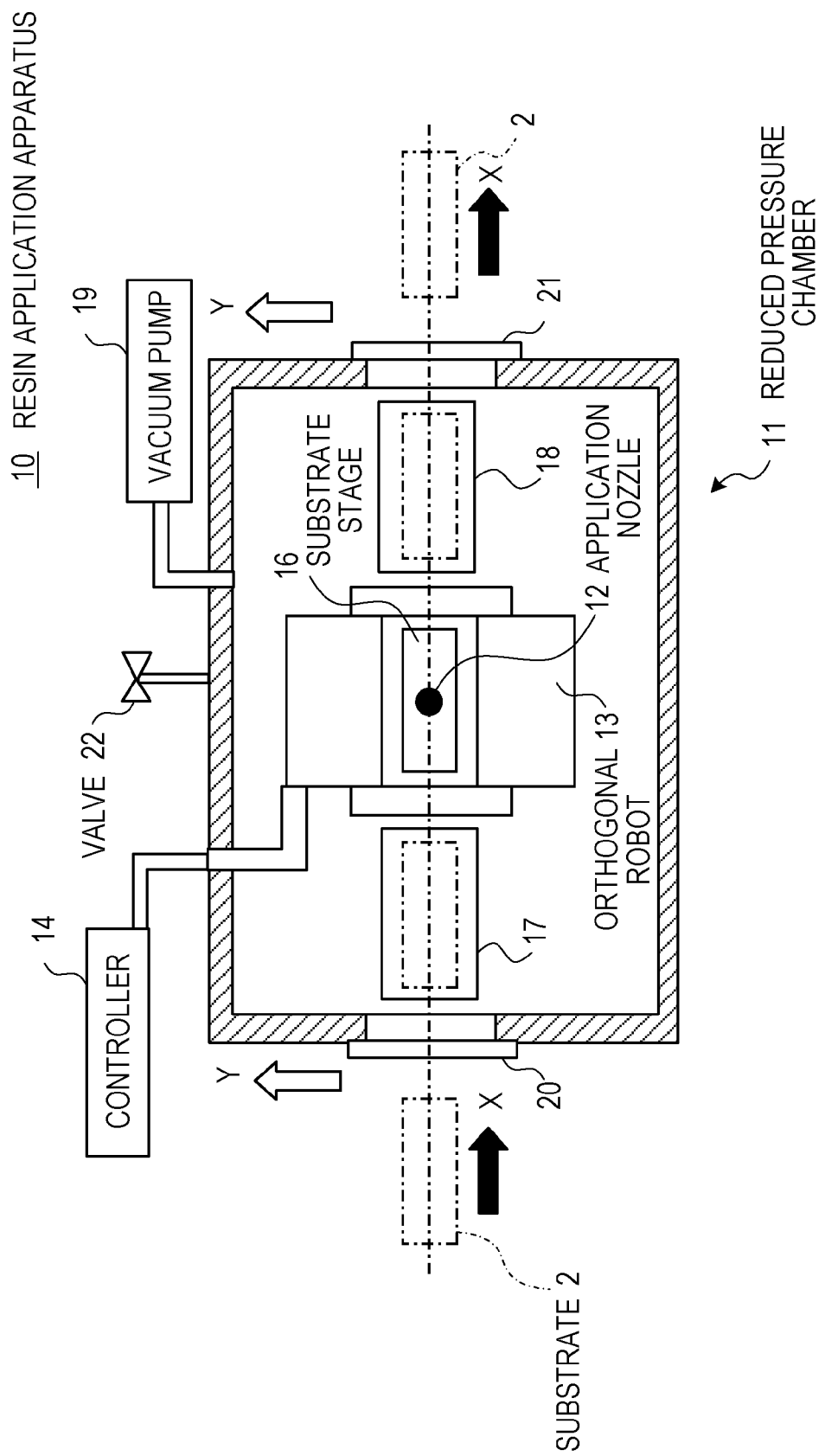
FIG. 3 illustrates a configuration of a resin application apparatus.

FIGS. 2A to 2D illustrate process steps for application of the underfill material 6. FIG. 3 illustrates a resin application apparatus 10 for application of the underfill material 6. With reference to FIGS. 2A to 2D, description is first directed to the reason why the generation of the void 7 can be suppressed by application of the underfill material 6 under a low pressure environment.

In mounting the chip 3 on the substrate 2, first, the chip 3 is provisionally fixed onto the substrate 2 by using an attractive arm 8, as illustrated in FIG. 2A. Specifically, with the electrode pads 9 previously applied with the bonding material 5, the bumps 4 are provisionally bonded to the respective electrode pads 9 by using the bonding material 5. In this step, the underfill material 6 may be placed centrally of the substrate 2.

Subsequently, the substrate 2 onto which the chip 3 has been provisionally fixed is placed in a reduced pressure chamber 11, followed by reduction in the internal pressure of the reduced pressure chamber 11. Further, the underfill material 6 is filled between the substrate 2 and the chip 3 from the periphery of the chip 3 by using an application nozzle 12. By previously placing the underfill material 6 centrally of the substrate 2, the generation of the void 7 can be suppressed to a certain extent. However, it is empirically known that the void 7 is undesirably generated as illustrated in FIG. 2C.

Even though the void 7 is generated between the substrate 2 and the chip 3 under the low pressure environment, when the semiconductor device 1 is removed from the reduced pressure chamber 11 into an atmospheric pressure environment, the volume of the void 7 is reduced due to an increase in the pressure of the environment. Thus, the void 7 becomes minute, which makes it possible to effectively suppress the occurrence of migration.

FIG. 3 illustrates the resin application apparatus 10 for use in the application of the underfill material 6 in the low pressure environment as described above. The resin application apparatus 10 includes as major components thereof the reduced pressure chamber 11, the application nozzle 12, an orthogonal robot 13, a controller 14, a substrate stage 16, substrate transfer stages 17 and 18, a vacuum pump 19, and the like.

The internal pressure of the reduced pressure chamber 11 is reduced by actuating the vacuum pump 19 with a valve 22 closed. By so doing, a low pressure environment is provided within the reduced pressure chamber 11. When the valve 22 is opened, atmospheric pressure is recovered within the reduced pressure chamber 11.

The reduced pressure chamber 11 is provided with an inlet door 20 and an outlet door 21. When the inlet door 20 is opened, the substrate 2 is allowed to be carried into the reduced pressure chamber 11. When the application of the underfill material 6 is completed, the outlet door 21 is opened to allow the substrate 2 to be carried out of the reduced pressure chamber 11.

The application nozzle 12 is a nozzle for applying the underfill material 6 between the substrate 2 and the chip 3. The application nozzle 12 is fixed to the reduced pressure chamber 11. The stages 16 to 18 are disposed in the reduced pressure chamber 11. The stages 16 to 18 each have the function of holding the substrate 2 thereon and the function of moving the substrate 2 in the direction of arrow X in FIG. 3. The substrate stage 16 is located on the orthogonal robot 13, while the substrate transfer stages 17 and 18 are fixed to a floor surface of the reduced pressure chamber 11.

The orthogonal robot 13 is configured to move the substrate stage 16 two-dimensionally. The orthogonal robot 13 is controlled by the controller 14. When the substrate stage 16 is moved by the orthogonal robot 13 to a position opposed to the substrate transfer stages 17 and 18 on a straight line, the substrate 2 is transferred between the substrate stage 16 and each of the substrate transfer stages 17 and 18.

With the substrate 2 loaded on the substrate stage 16, a low pressure environment is provided in the reduced pressure chamber 11 by reducing the internal pressure of the reduced pressure chamber 11. The application nozzle 12 moves along the periphery of the chip 3 (not illustrated in FIG. 3) positioned relative to the substrate 2 while delivering the underfill material 6 under the reduced pressure environment, thereby filling the underfill material 6 between the substrate 2 and the chip 3.

FIG. 4 illustrates process steps performed for application (i.e., filling) of the underfill material 6 by using the resin application apparatus 10. The upper section of FIG. 4 presents the process steps (steps A to G) performed in the reduced pressure chamber 11, while the lower section presents changes in the internal pressure of the reduced pressure chamber 11. In the section presenting the process steps performed in the chamber, the process steps indicated by solid line are process steps for the first substrate 2 and the process steps indicated by broken line are process steps for the second substrate 2. The following description is based on the precondition that the chip 3 has been already mounted on the substrate 2.

When the application process for the first substrate 2 starts, the inlet door 20 is first opened to allow the substrate 2 to be carried into the reduced pressure chamber 11 (step A). At that time, the internal pressure of the reduced pressure chamber 11 is atmospheric pressure.

When the substrate 2 has been carried into the reduced pressure chamber 11, the substrate 2 is held on the substrate transfer stage 17. When the substrate 2 has been held on the substrate transfer stage 17, the vacuum pump 19 is actuated to reduce the internal pressure of the reduced pressure chamber 11 (step B). When the internal pressure of the reduced pressure chamber 11 has been reduced, the substrate 2 is transferred from the substrate transfer stage 17 onto the substrate stage 16 located on the orthogonal robot 13 (step C).

When the substrate 2 has been transferred onto the substrate stage 16, the application nozzle 12 and the orthogonal robot 13 are actuated to apply the underfill material 6 between the substrate 2 and the chip 3 (step D). The application of the underfill material 6 is carried out under a predetermined low pressure environment in order to suppress the generation of the void 7, as described above.

When the underfill material 6 has been applied between the substrate 2 and the chip 3, waiting follows for the underfill material 6 to penetrate into the clearance between the substrate 2 and the chip 3 (step E). The underfill material 6 penetrates into the fine clearance between the substrate 2 and the chip 3 by capillarity. A predetermined time period (e.g., 150 seconds) is required for the penetration of the underfill material 6. Like the application of the underfill material 6, the penetration of the underfill material 6 is performed under the low pressure environment.

When the application and penetration of the underfill material 6 have been completed as described above, the vacuum pump 19 is stopped and the valve 22 is opened to increase the internal pressure of a transfer chamber 31A (step F). This pressure increasing step causes the volume of the void 7 generated in the underfill material 6 to be reduced as described above.

When the internal pressure of the transfer chamber 31A reaches atmospheric pressure, the substrate 2 is transferred from the substrate stage 16 onto the substrate transfer stage 18. Then, the outlet door 21 is opened to allow the substrate 2 to be carried out of the reduced pressure chamber 11 from the substrate transfer stage 18 (step G).

At the same time with the removal of the substrate 2 from the reduced pressure chamber 11, the inlet door 20 is opened and the succeeding substrate 2 (not yet applied with the underfill material 6) to be subsequently subjected to the process is carried into the reduced pressure chamber 11 (step A).

The above-described steps A to G are performed for the succeeding substrate 2. As the process proceeds, reducing and increasing the internal pressure of the reduced pressure chamber 11 is performed.

FIG. 5 illustrates a configuration of a resin application apparatus 30 as one embodiment of the present invention. The resin application apparatus 30 is configured to carry out application (i.e., filling) of the underfill material 6 between the substrate 2 and the chip 3 in a process for fabricating the semiconductor device 1 (see FIG. 1A). The resin application apparatus 30 includes as major components thereof a transfer chamber 31A an application chamber 31B, an application nozzle 32, an orthogonal robot 33, a controller 34, a substrate transfer unit 35, and the like.

The resin application apparatus 30 has two chambers, namely, the transfer chamber 31A and the application chamber 31B. Though the transfer chamber 31A and the application chamber 31B are formed integrally with each other, the chambers 31A and 31B are delimited from each other by a partition wall 44. The partition wall 44 defines a transfer opening 44a to be opened and closed by a transfer door 43.

Figure 6:
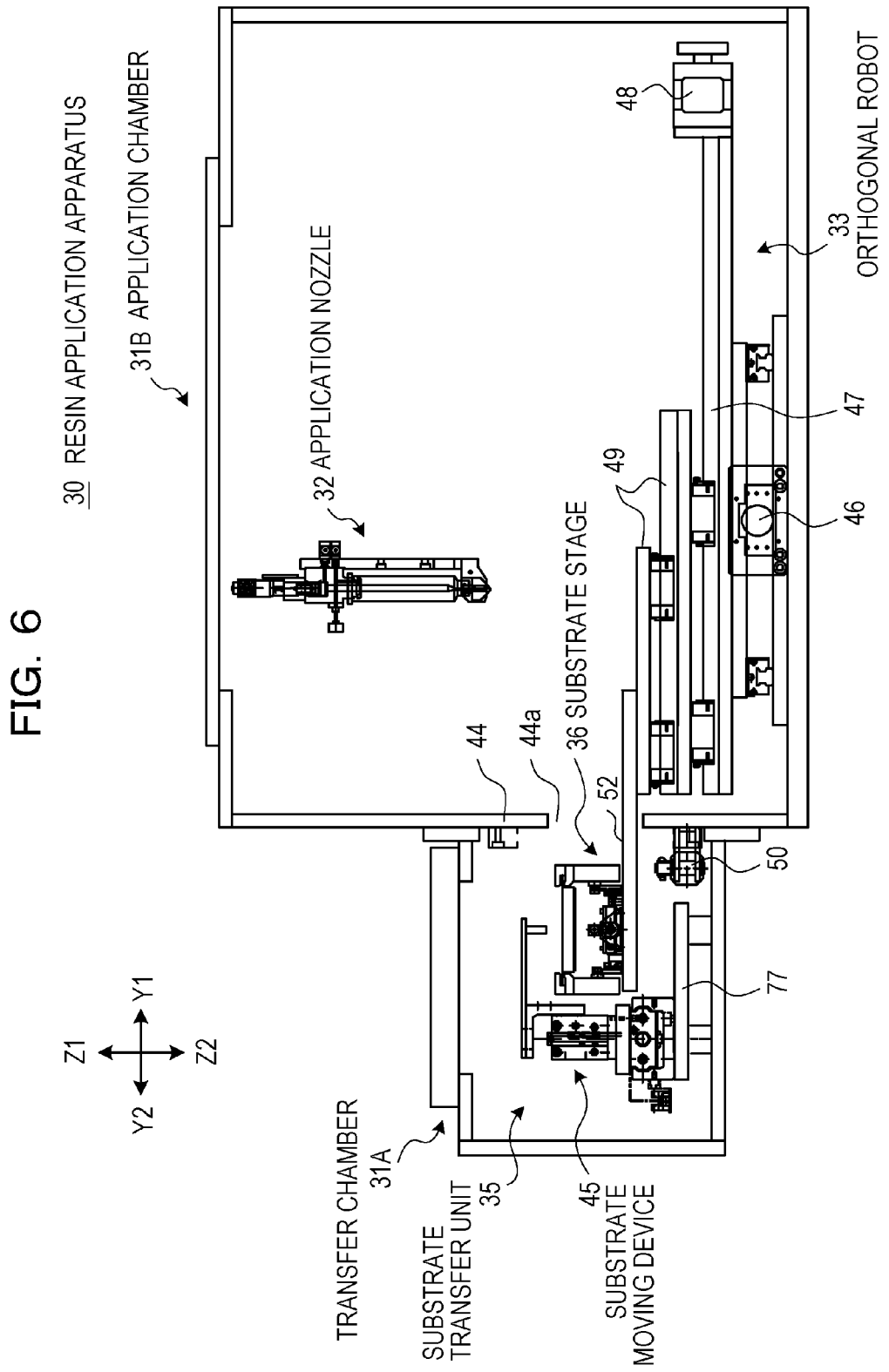
FIG. 6 illustrates a sectional view taken along line A-A of FIG. 5.

The transfer door 43 is opened and closed by a door opening and closing motor 50 (see FIGS. 6 and 7). The transfer chamber 31A and the application chamber 31B communicate with each other when the transfer door 43 is opened. When the transfer door 43 is closed, the transfer chamber 31A and the application chamber 31B are air-tightly delimited from each other.

Thus, the transfer chamber 31A and the application chamber 31B are configured to be capable of setting to different internal pressures. The door opening and closing motor 50 is connected to the controller 34 and, hence, the opening and closing of the transfer door 43 is controlled by the controller 34.

The transfer chamber 31A is formed with an inlet opening 84 in a wall portion lying on the arrow X2 direction side in FIG. 5 and an outlet opening 85 in a wall portion lying on the arrow X1 direction side in FIG. 5 which is opposite away from the inlet opening 84. The inlet opening 84 is provided with an inlet door 40. By opening the inlet door 40, the substrate 2 is allowed to be carried into the transfer chamber 31A through the inlet opening 84. By closing the inlet door 40, the inlet opening 84 is sealed air-tightly.

On the other hand, the outlet opening 85 is provided with an outlet door 41. By opening the outlet door 41, the substrate 2 having been applied with the underfill material 6 after completion of a resin sealing step to be described later is allowed to be carried out of the transfer chamber 31A. By closing the outlet door 41, the outlet opening 85 is sealed air-tightly. The inlet door 40 and the outlet door 41 are opened and closed by a non-illustrated door opening and closing motor. The door opening and closing motor is connected to the controller 34 and, hence, the opening and closing of each of the inlet door 40 and outlet door 41 is controlled by the controller 34.

The transfer chamber 31A has a vacuum pump 39A and a valve 42A. The internal pressure of the transfer chamber 31A is reduced by actuating the vacuum pump 39A with the valve 42A closed. By opening the valve 42A under a reduced pressure condition, the internal pressure of the transfer chamber 31A increases to atmospheric pressure.

The application chamber 31B has a vacuum pump 39B and a valve 42B. The internal pressure of the application chamber 31B is reduced by actuating the vacuum pump 39B with the valve 42B closed. By opening the valve 42B under a reduced pressure condition, the internal pressure of the application chamber 31B increases to atmospheric pressure.

The vacuum pumps 39A and 39B are each connected to the controller 34. Accordingly, the internal pressure of each of the transfer chamber 31A and the application chamber 31B is controlled by the controller 34.

The substrate transfer unit 35 is disposed in the transfer chamber 31A. The substrate transfer unit 35 includes a substrate stage 36, substrate transfer stages 37 and 38, and a substrate moving device 45. The substrate transfer stage 37 is located adjacent the inlet opening 84 of the transfer chamber 31A. The substrate transfer stage 38 is located adjacent the outlet opening 85 of the transfer chamber 31A.

A space for positioning the substrate stage 36 having been moved by the orthogonal robot 33 is provided in a portion which is opposed to a transfer opening 44a and lies between the substrate transfer stages 37 and 38, as will be described later. Further, the substrate moving device 45 is located at a lateral side of the substrate transfer stages 37 and 38 lying on the arrow Y2 direction side in the figure and extends in the directions of transfer of the substrate 2 (i.e., X1 and X2 directions).

In the application chamber 31B, on the other hand, there are disposed the application nozzle 32, the orthogonal robot 33, the substrate stage 36, and the like. The application nozzle 32 is fixed to the ceiling of the application chamber 31B and configured to deliver the underfill material 6 from a lower end portion thereof (i.e., the end portion oriented in the Z2 direction). The application nozzle 32 is vertically expandable and retractable (in the directions of arrows Z1 and Z2 in the figure). The application nozzle 32 is connected to the controller 34 and, hence, the expansion and retraction of the application nozzle 32 is controlled by the controller 34.

As illustrated in FIGS. 6 and 7, the orthogonal robot 33 has an X-axis translation stage 47 and a Y-axis motor 48. The X-axis translation stage 47 is driven by an X-axis motor 46 and serves to move a Y-axis translation stage 49 located thereon in the directions of arrows X1 and X2. The Y-axis translation stage 49 is driven by the Y-axis motor 48 and serves to move the substrate stage 36 located thereon in the directions of arrows Y1 and Y2. The X-axis motor 46 and the Y-axis motor 48 are connected to the controller 34 and, hence, the operation of the orthogonal robot 33 is controlled by the controller 34.

A support base portion 52 is fixed to the Y-axis translation stage 49. The substrate stage 36 is mounted on an end portion of the support base portion 52 (the end portion on the Y2 direction side). The substrate stage 36 and the substrate transfer stages 37 and 38 located in the transfer chamber 31A have substantially the same structure. For this reason, the stages 36, 37 and 38 will be collectively described with reference to FIGS. 8A to 8C and 9A to 9C. In describing the substrate stage 36 and the substrate transfer stages 37 and 38 collectively, the stages 36, 37 and 39 will be referred to as "stage 36,37,38".

Figure 8A:
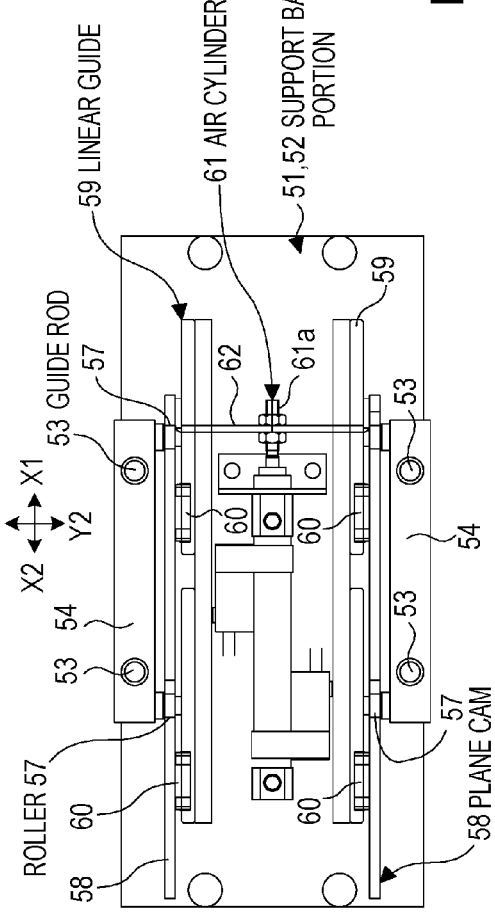
FIG. 8A illustrates a state in which a hot plate is in a raised position.
Figure 8B:
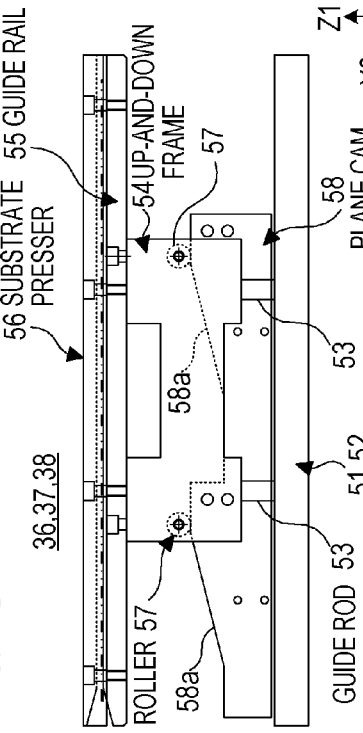
FIG. 8B illustrates a front side of a stage in a state in which the hot plate is in the raised position.
Figure 8C:
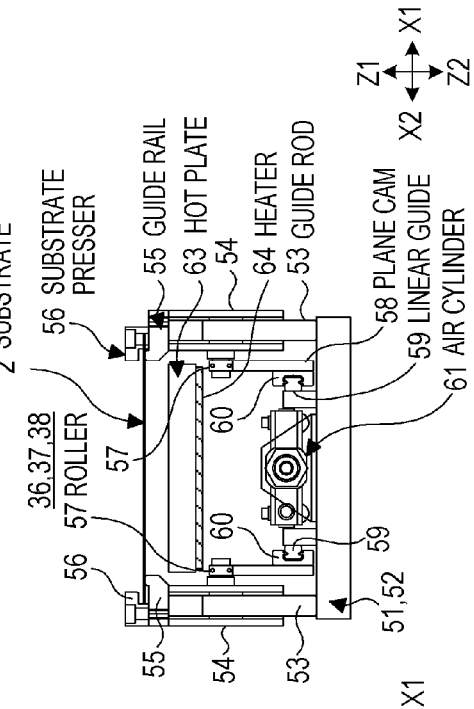
FIG. 8C illustrates a lateral side of the stage in the state in which the hot plate is in the raised position.

FIGS. 8A, 8B and 8C illustrate the stage 36,37,38 in a state in which a hot plate 63 is in a raised position, while FIGS. 9A, 9B and 9C illustrate the stage 36,37,38 in a state in which the hot plate 63 is in a lowered position. The stage 36,37,38 includes as major components thereof support base portions 51 and 52, guide rods 53, up-and-down frames 54, guide rails 55, guide pressers 56, plane cams 58, linear guides 59, an air cylinder 61, and the like.

The support base portion 51 serves as a base supporting the substrate transfer stages 37 and 38, while the support base portion 52 serves as a base supporting the substrate stage 36. The support base portion 51 is fixed to a stationary pedestal 78. Thus, the substrate transfer stages 37 and 38 are fixed in the transfer chamber 31A. The support base portion 52 is located on the orthogonal robot 33 as described above. Thus, the substrate stage 36 can be moved two-dimensionally (i.e., in the X and Y directions) by the orthogonal robot 33.

As illustrated in FIG. 6, the substrate stage 36 can be moved by the orthogonal robot 33 from the application chamber 31B into the transfer chamber 31A through the transfer opening 44a when the transfer door 43 is open. When the substrate stage 36 has been moved into the transfer chamber 31A, the substrate 2 is allowed to be transferred between the substrate transfer stage 37 and the substrate stage 36 and between the substrate stage 36 and the substrate transfer stage 38, as will be described later.

The guide rods 53 stand upright on the support base portion 51,52. The present embodiment includes four guide rods 53. A pair of guide rods 53 is provided along each of the long sides (extending in the X1 and X2 directions) of the support base portion 51,52. The two pairs of guide rods 53 are fitted with the respective up-and-down frames 54 for up-and-down movement. The pair of up-and-down frames 54 have opposed surfaces (i.e., inner surfaces) each provided with rollers 57 and engaging portions 60.

Figure 10:
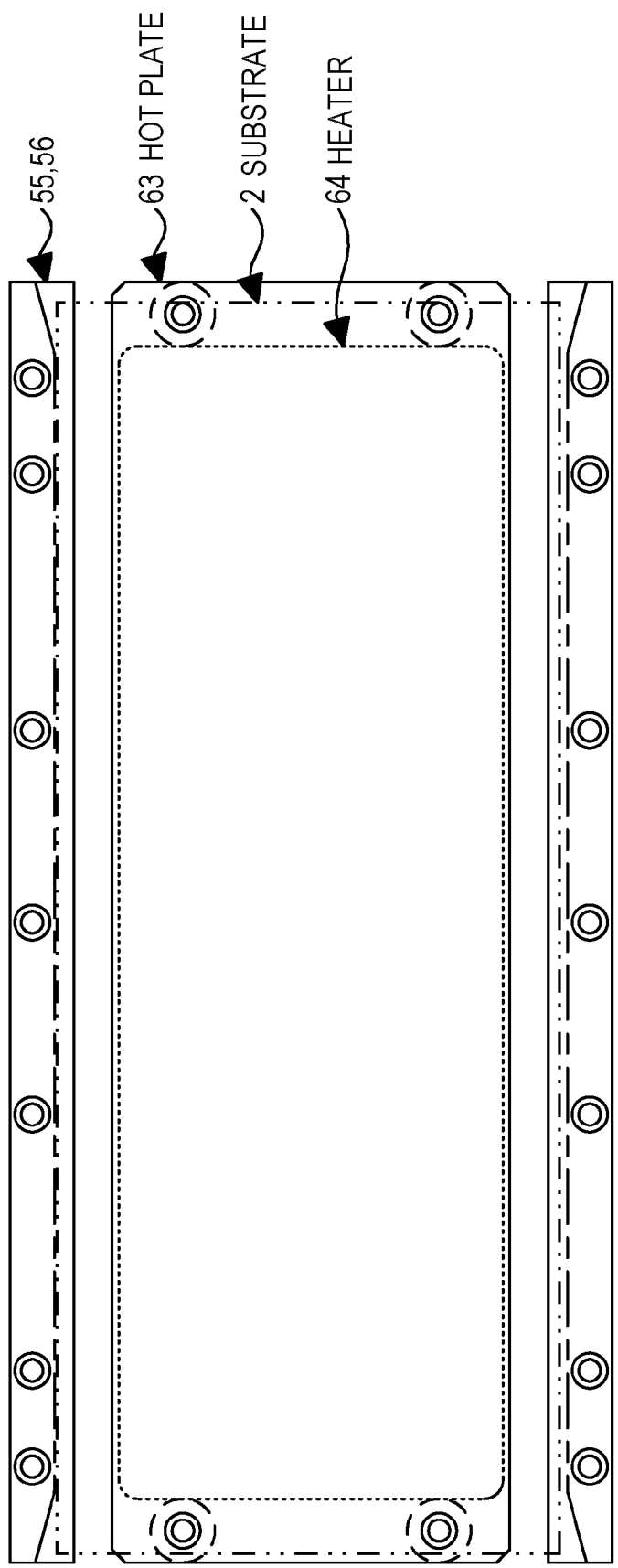
FIG. 10 illustrates the substrate stage/substrate transfer stage in a state of being fitted with the hot plate.

The guide rails 55 and the guide pressers 56 are mounted on upper end portions of the guide rods 53. The guide rails 55 and the guide pressers 56 are elongated in the directions of arrows X1 and X2 (i.e., the directions in which the substrate 2 is transferred) in the figures. As illustrated in FIG. 10, the guide rails 55 and the guide pressers 56 engage with the opposite long side edges of the substrate 2 during transfer of the substrate 2 and guide the movement of the substrate 2 being transferred. FIG. 10 is a schematic plan view of a portion of concern of the stage 36,37,38.

Each of the guide pressers 56 is superposed on top of a respective one of the guide rails 55 and guides the substrate 2 so as to prevent the substrate 2 from coming off upwardly from the guide rods 53 during transfer of the substrate 2. As will be described later, the hot plate 63 moves up and down relative to the substrate 2 (in the Z1 and Z2 directions). When the hot plate 63 moves up, the substrate 2 is held between the guide pressers 56 and the hot plate 63. Thus, the substrate 2 is held on the stage 36,37,38.

The hot plate 63 is provided with a heater 64 on its underside. With the substrate 2 being held between the hot plate 63 and the guide pressers 56, the hot plate 63 is in contact with substantially the entire surface of the substrate 2 (see FIG. 10). Accordingly, the substrate 2 is heated by the heater 64 through the hot plate 63. (The heating of the substrate 2 by the heater 64 will be described in detail later.)

The plane cams 58 are mounted on the support base portion 51,52 so as to be capable of moving in the longitudinal direction of the support base portion 51,52 (in the directions of arrows X1 and X2). Specifically, the linear guides 59 extending in the directions of arrows X1 and X2 are formed on top of the support base portion 51,52. The engaging portions 60 provided on each plane cam 58 movably engage with the associated linear guide 59 (as better illustrated in FIGS. 8C and 9C). Therefore, the plane cams 58 are capable of accurately moving in the X1 and X2 directions as guided by the linear guides 59.

Each of the plane cams 58 has an upper edge formed with two inclined cam portions 58a. The two inclined cam portions 58a have the same structure and are engaged with the rollers 57 provided on each of the up-and-down frames 54. Each of the inclined cam portions 58a is formed of an inclined surface which gradually becomes higher relative to the surface of the support base portion 51,52 as it extends in the direction of arrow X1 (see FIGS. 8B and 9B). As described above, the up-and-down frames 54 are vertically movably mounted on the guide rods 53.

Thus, as each plane cam 58 moves in the direction of arrow X2, the rollers 57 roll on the respective inclined cam portions 58a to cause the associated up-and-down frame 54 to move upwardly (in the Z1 direction). Conversely, as each plane cam 58 moves in the direction of arrow X1, the associated up-and-down frame 54 moves downwardly (in the Z2 direction). As described above, the hot plate 63 is fixed to the up-and-down frames 54. Therefore, as the up-and-down frames 54 move up and down with movement of the plane cams 58 in the directions of arrows X1 and X2, the hot plate 63 also moves up and down.

The air cylinder 61 is located at a substantially central portion of the support base portion 51,52 which lies between the pair of plane cams 58. The air cylinder 61 has a cylinder shaft 61a joined to a side arm 62 extending between the pair of plane cams 58.

When the air cylinder 61 is actuated, the cylinder shaft 61a expands and retracts to urge the side arm 62 to move in the directions of arrows X1 and X2, thus causing the pair of plane cams 58 to move in the directions of arrows X1 and X2. Since the air cylinder 61 is connected to the controller 34, the controller 34 controls the movement of the plane cams 58 and the up-and-down movement of the hot plate 63.

Description will be made of the substrate moving device 45 with main reference to FIGS. 11A, 11B, 12A and 12B. The substrate moving device 45 has the function of transferring the substrate 2 between the above-described stages 36, 37 and 38.

Figure 11A:
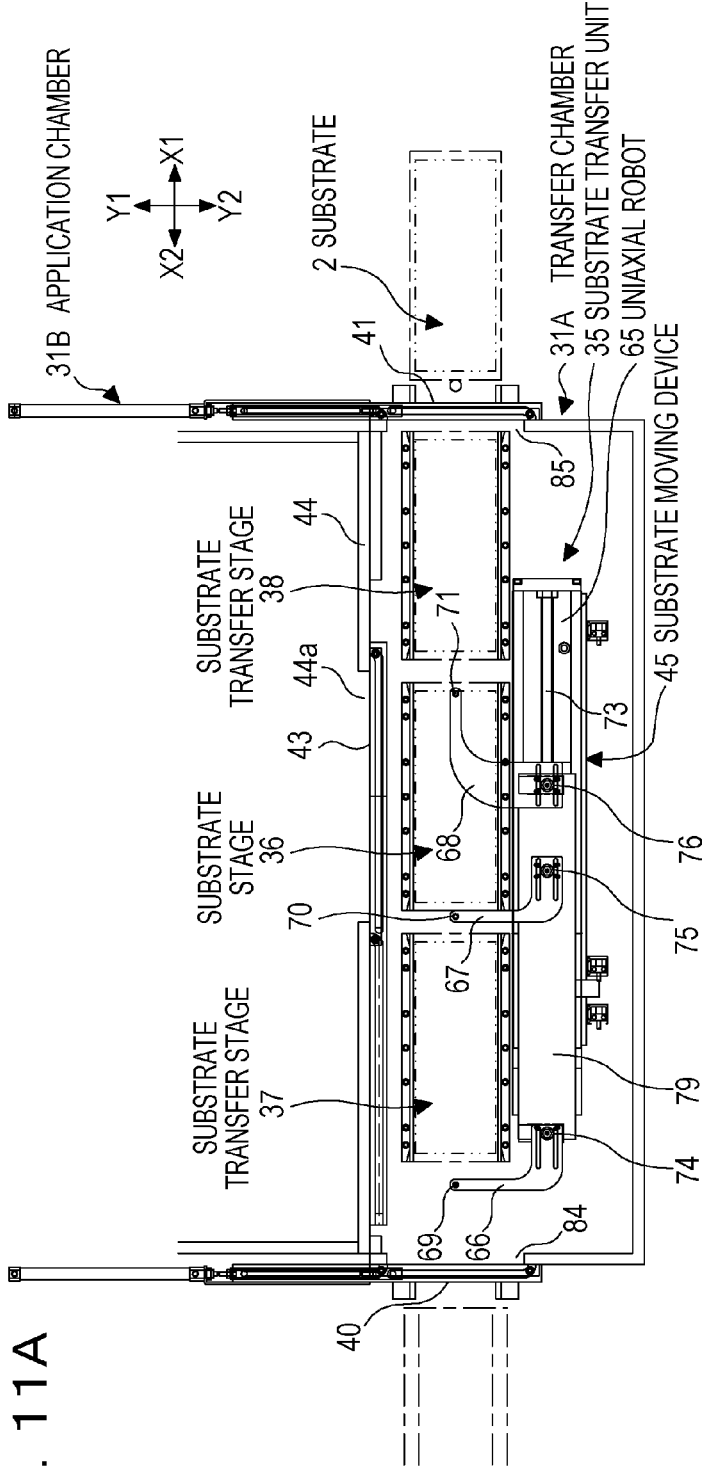
FIG. 11A illustrates a substrate transfer unit.
Figure 11B:
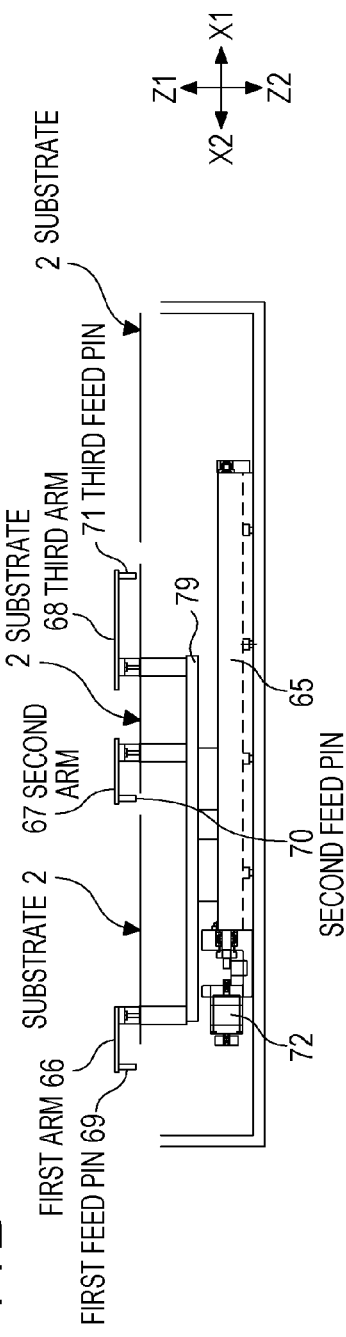
FIG. 11B illustrates a substrate moving device.

FIGS. 11A and 11B are a plan view and a front elevational view, respectively, illustrating the entire structure of the substrate transfer unit 35 in a state in which the stages 36, 37 and 38 are aligned on a straight line in the X1 and X2 directions after the substrate stage 36 has been moved into the transfer chamber 31A by the orthogonal robot 33 (not illustrated in FIGS. 11A and 11B). FIGS. 12A and 12B are each an enlarged side elevational view of the substrate transfer unit 35.

The substrate moving device 45 includes a uniaxial robot 65, first to third arms 66 to 68, first to third feed pins 69 to 71, air cylinders 74 to 76, a moving table 79, and the like.

The uniaxial robot 65 has an elongate shape extending on the floor surface of the transfer chamber 31A in the directions of arrows X1 and X2. The uniaxial robot 65 has a transfer motor 72 and a ball thread 73. The ball thread 73 is rotated by actuating the transfer motor 72. The ball thread 73 is in engagement with the moving table 79 and, hence, rotation of the ball thread 73 causes the moving table 79 to move in the directions of arrow X1 and X2 in the figures.

The distance to be traveled by the moving table 79 is determined from the amount of rotation of the transfer motor 72. The transfer motor 72 is connected to the controller 34 and, hence, the amount of rotation of the transfer motor 72 is controlled by the controller 34. Accordingly, the controller 34 controls the movement of the moving table 79.

The first to third arms 66 to 68 are fixed on top of the moving table 79 as arranged with predetermined intervals in this order in the X1 direction from an end portion of the moving table 79 which lies in the X2 direction. As illustrated in FIG. 11A, the first to third arms 66 to 68 are each substantially L-shaped in plan view. Each of the first to third arms 66 to 68 has an end portion on the moving table side which is fixed to the moving table 79 via a respective one of the air cylinders 74 to 76. End portions of the first to third arms 66 to 68 which lie away from the moving table are each provided with a respective one of the first to third feed pins 69 to 71.

In the following description, the first to third arms 66 to 68 will be referred to as "arm 66,67,68" when described collectively, and the first to third feed pins 69 to 71 will be referred to as "feed pin 69,70,71" when described collectively.

The air cylinders 74 to 76 serve to move the arms 66 to 68 in the directions of arrows Z1 and Z2 (i.e., to move them up and down). Specifically, the air cylinder 74 causes the first arm 66 to move up and down, thereby moving the first feed pin 69 mounted on the first arm 66 up and down. The air cylinder 75 causes the second arm 67 to move up and down, thereby moving the second feed pin 70 mounted on the second arm 67 up and down. The air cylinder 76 causes the third arm 68 to move up and down, thereby moving the third feed pin 71 mounted on the third arm 68 up and down.

Here, further description will be made of the operations of the first to third feed pins 69 to 71 with reference to FIGS. 12A and 12B. FIGS. 12A and 12B are each a schematic view illustrating a right-hand side of the substrate transfer unit 35.

The stage 36,37,38 illustrated in FIGS. 12A and 12B is in a state in which the hot plate 63 is in the lowered position. In this state, the substrate 2 is placed on the guide rails 55, while the guide rails 55 and the guide pressers 56 define a clearance therebetween. Therefore, the substrate 2 is not fixed and hence can move in the X1 and X2 directions (i.e., in the directions perpendicular to the drawing sheet of each of FIGS. 12A and 12B).

FIG. 12A illustrates a state in which the arm 66,67,68 has been raised by the air cylinders 74 to 76. With the arm 66,67,68 in the raised position, the feed pin 69,70,71 mounted on the arm 66,67,68 is also in the raised position. The feed pin 69,70,71 in the raised position is spaced apart from the substrate 2. Therefore, with the feed pin 69,70,71 in the raised position, even when the moving table 79 moves in the directions of arrows X1 and X2 by the operation of the uniaxial robot 65, the feed pin 69,70,71 moves above the substrate 2 and, hence, the substrate 2 fails to move.

By contrast, FIG. 12B illustrates a state in which the arm 66,67,68 has been lowered by the air cylinders 74 to 76. With the arm 66,67,68 in the lowered position, the feed pin 69,70,71 mounted on the arm 66,67,68 is also in the lowered position. The feed pin 69,70,71 in the lowered position is engageable with a short side of the substrate 2 which lies on the arrow X2 side (see FIG. 11).

Therefore, with the feed pin 69,70,71 in the lowered position, when the moving table 79 moves in the direction of arrow X1 by the operation of the uniaxial robot 65, the feed pin 69,70,71 engages with the substrate 2 and urges the substrate 2 to move in the direction of arrow X1. Thus, the substrate 2 is moved in the direction of arrow X1 by the movement of the feed pin 69,70,71 while being guided by the stage 36,37,38. At that time, the opposite side edges of the substrate 2 are held (guided) between the guide rails 55 and the guide pressers 56 as described above, while the feed pin 69,70,71 engages a substantially central portion of the short side of the substrate 2. For this reason, the substrate 2 can be moved stably.

With reference to FIGS. 13A, 13B, 14A, 14B, 15A, 15B, 16A, 16B, 17 and 18, description will be made of specific operations of the substrate transfer unit 35 having the above described configuration which are performed when the substrate 2 is transferred in the transfer chamber 31A.

FIGS. 13A, 13B, 14A, 14B, 15A, 15B, 16A, 16B, 17 and 18 illustrate only major components of the substrate transfer unit 35 and substrate moving device 45 in a state in which the stages 36, 37 and 38 are aligned in the X1 and X2 directions after the substrate stage 36 has moved into the transfer chamber 31A. The following description is directed to the operations performed after the substrate 2 has been transferred onto the substrate transfer stage 37.

To be described first is the operation of transferring the substrate 2 held on the substrate transfer stage 37 onto the substrate stage 36. The operation of transferring the substrate 2 onto the substrate stage 36 is controlled by the controller 34.

In transferring the substrate 2 onto the substrate stage 36, the controller 34 actuates the transfer motor 72 of the substrate moving device 45 to move the moving table 79 to the arrow X2 direction end. At the time of this movement of the moving table 79, all the feed pins 69 to 71 have been raised by the air cylinders 74 to 76 to assume their raised positions which are higher than the positions for holding the substrate 2. Accordingly, when the feed pin 69,70,71 mounted on the arm 66,67,68 moves in the X2 direction with the movement of the moving table 79, the feed pin 69,70,71 fails to collide with the substrate 2.

Figure 13B:
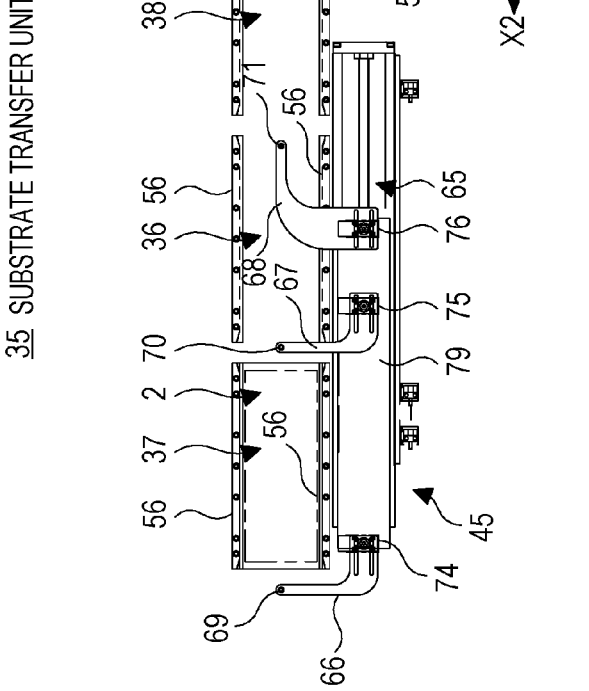
FIG. 13B illustrates a substrate transfer unit.
Figure 13A:
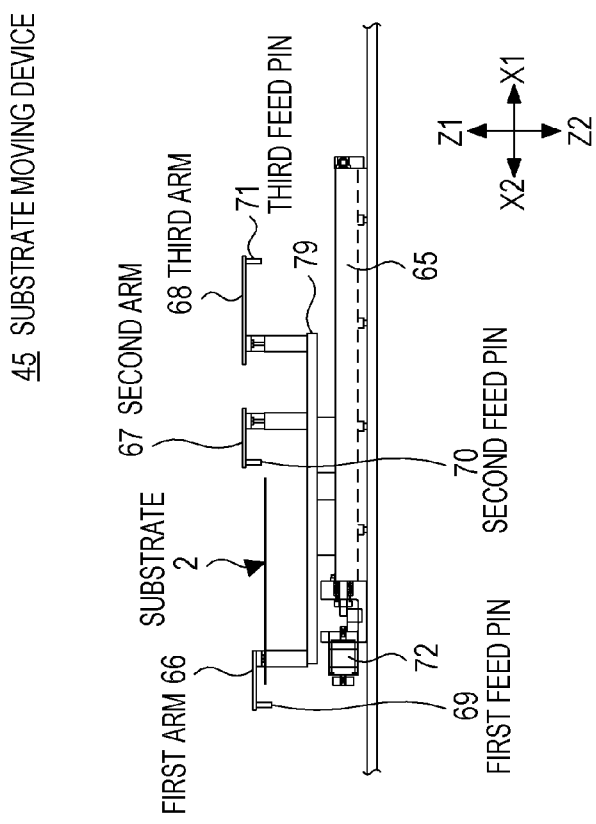
FIG. 13A illustrates a front side of a substrate moving device.

When the moving table 79 reaches the arrow X2 direction end, the controller 34 actuates the air cylinder 74 to lower only the first feed pin 69. Thus, only the first feed pin 69 of the feed pins 69 to 71 becomes engageable with the substrate 2. FIGS. 13A and 13B illustrate a state in which the first feed pin 69 is in the lowered position.

Figure 14A:
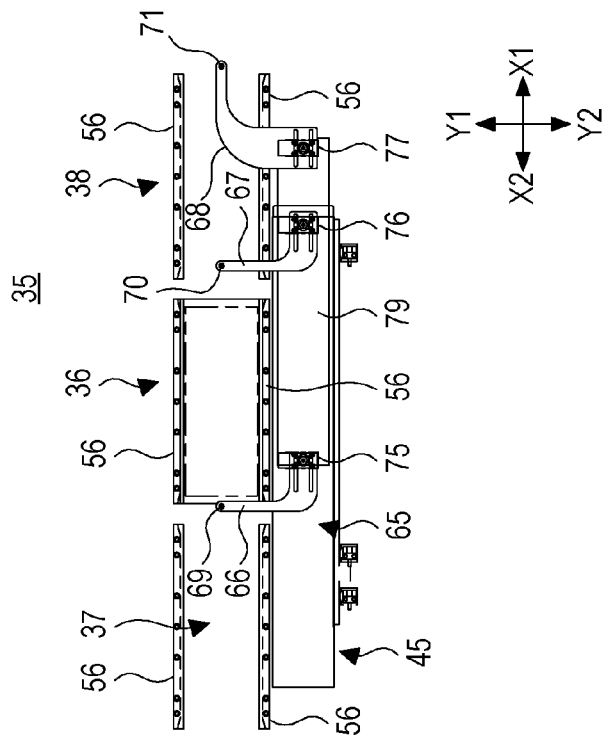
FIG. 14A illustrates a front side of a substrate moving device.
Figure 14B:
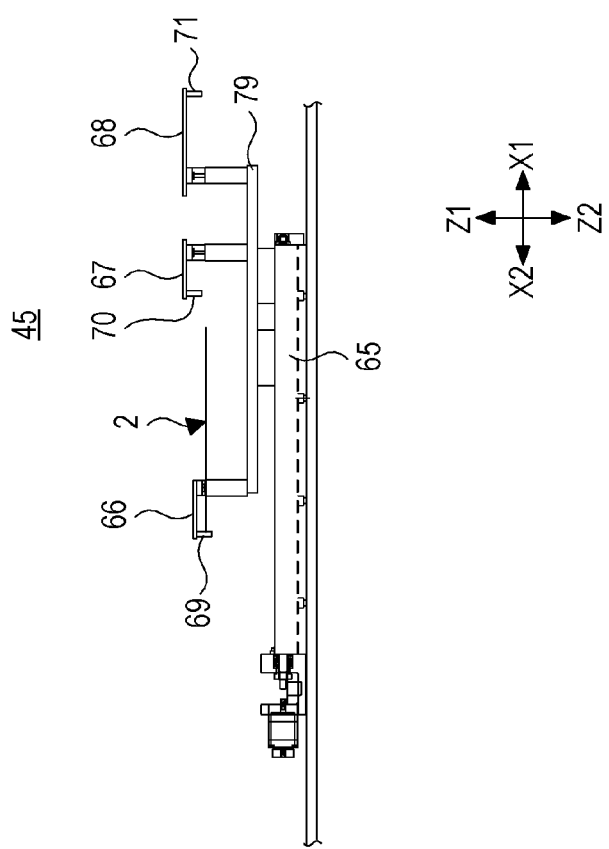
FIG. 14B illustrates a substrate transfer unit.

Subsequently, the controller 34 actuates the transfer motor 72 to move the moving table 79 in the direction of arrow X1. With the movement of the moving table 79, the first arm 66 also moves in the direction of arrow X1 to cause the first feed pin 69 to engage with the substrate 2. As the moving table 79 moves further, the first feed pin 69 urges the substrate 2 to start moving in the direction of arrow X1. At the time when the substrate 2 has been transferred from the substrate transfer stage 37 onto the substrate stage 36, the controller 34 stops the transfer motor 72. In this way, the substrate 2 is transferred from the substrate transfer stage 37 onto the substrate stage 36. FIGS. 14A and 14B illustrate a state in which the substrate 2 has been transferred onto the substrate stage 36.

As will be described later, after the substrate 2 has been transferred onto the substrate stage 36, the substrate stage 36 is moved into the application chamber 31B for the substrate 2 to be subjected to the application of the underfill material 6 and the like. When the substrate stage 36 has been moved into the transfer chamber 31A again after completion of the application of the underfill material 6, the operation of transferring the substrate 2 onto the substrate transfer stage 38 is performed.

In transferring the substrate 2 from the substrate stage 36 onto the substrate transfer stage 38, the controller 34 actuates the transfer motor 72 to move the moving table 79 to a position in which the second feed pin 70 mounted on the second arm 67 is opposed to a short side of the substrate 2 held on the substrate stage 36 which lies on the X2 direction side.

At the time of this movement also, all the feed pins 69 to 71 have been raised by the air cylinders 74 to 76 to assume their raised positions which are higher than the positions for holding the substrate 2. Accordingly, the feed pin 69,70,71 fails to collide with the substrate 2 during the movement of the moving table 79.

Figure 15B:
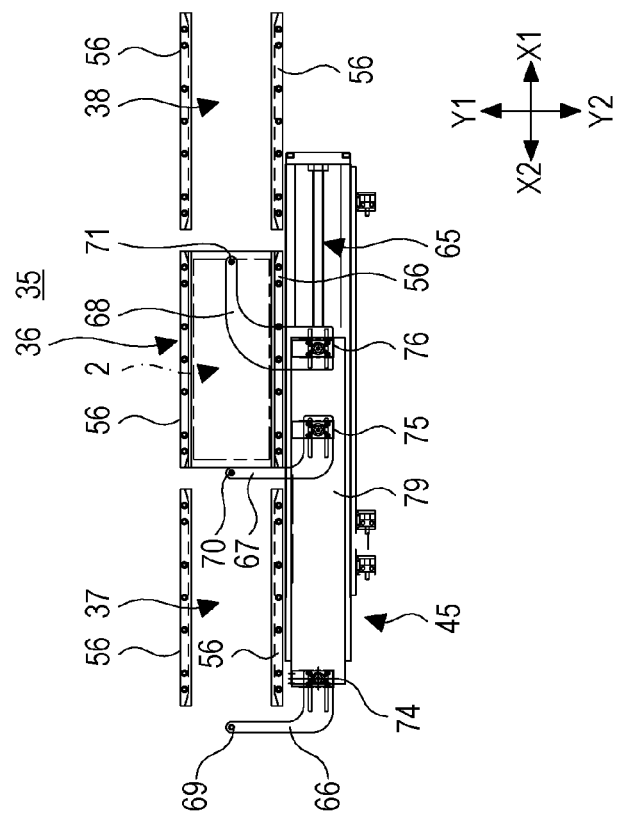
FIG. 15B illustrates a front side of a substrate moving device.
Figure 15A:
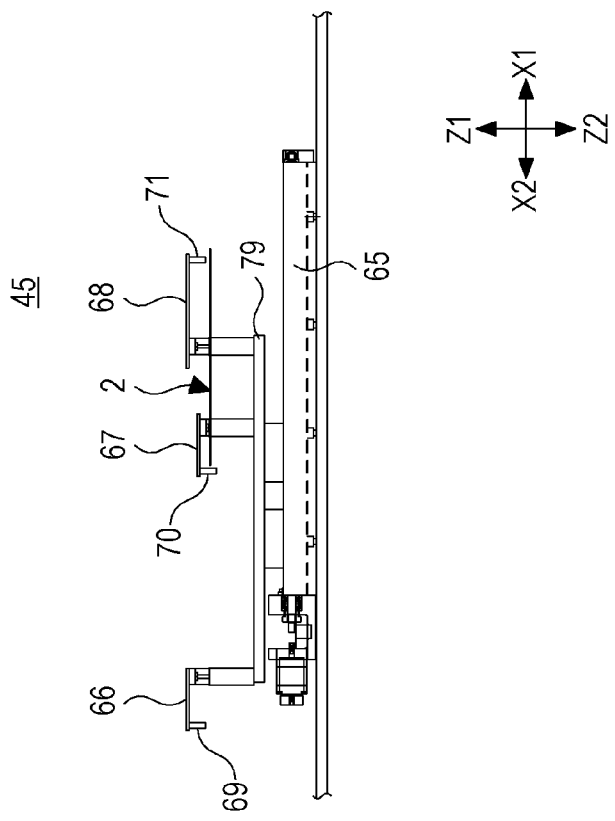
FIG. 15A illustrates a substrate transfer operation.

When the second feed pin 70 has reached the position opposed to the above-described short side of the substrate 2, the controller 34 actuates the air cylinder 75 to lower only the second feed pin 70. Thus, only the second feed pin 70 of the feed pins 69 to 71 becomes engageable with the substrate 2. FIGS. 15A and 15B illustrate a state in which the second feed pin 70 is in the lowered position.

Figure 16B:
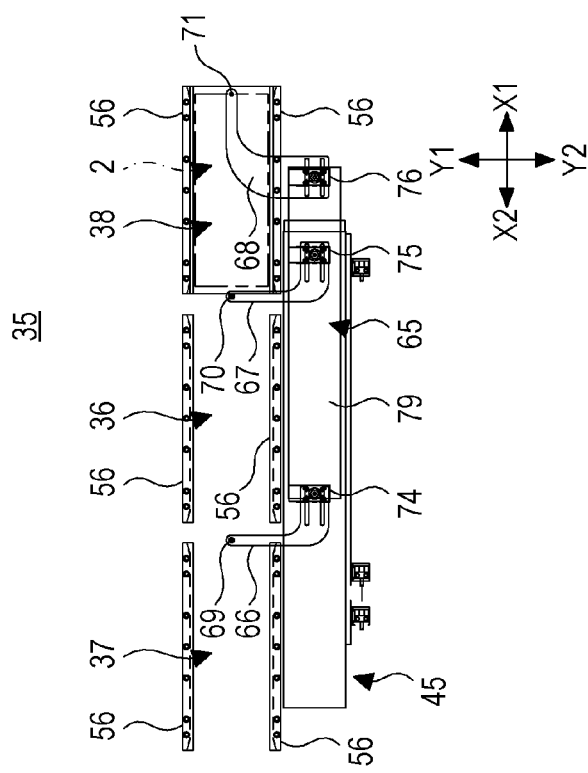
FIG. 16B illustrate a front side of a substrate transfer unit.
Figure 16A:
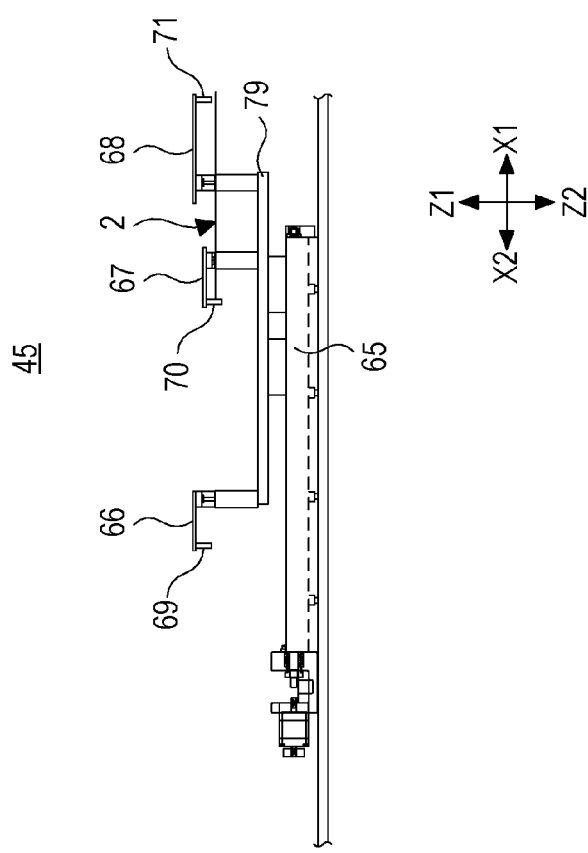
FIG. 16A illustrates a front side of a substrate moving device.

Subsequently, the controller 34 actuates the transfer motor 72 to move the moving table 79 in the direction of arrow X1. With the movement of the moving table 79, the second arm 67 also moves in the direction of arrow X1 to cause the second feed pin 70 to engage with the substrate 2. As the moving table 79 moves further, the second feed pin 70 urges the substrate 2 to start moving in the direction of arrow X1. At the time when the substrate 2 has been transferred from the substrate stage 36 onto the substrate transfer stage 38, the controller 34 stops the transfer motor 72. In this way, the substrate 2 is transferred from the substrate stage 36 onto the substrate transfer stage 38. FIGS. 16A and 16B illustrate a state in which the substrate 2 has been transferred onto the substrate transfer stage 38.

In carrying the substrate 2 held on the substrate transfer stage 38 from the transfer chamber 31A to the outside, the controller 34 actuates the transfer motor 72 to move the moving table 79 to a position in which the third feed pin 71 mounted on the third arm 68 is opposed to the short side of the substrate 2 held on the substrate stage 36 which lies on the X2 direction side.

At the time of this movement also, all the feed pins 69 to 71 have been raised by the air cylinders 74 to 76 to assume their raised positions which are higher than the positions for holding the substrate 2. Accordingly, the feed pin 69, 70, 71 fails to collide with the substrate 2 during the movement of the moving table 79.

When the third feed pin 71 has reached the position opposed to the above-described short side of the substrate 2, the controller 34 actuates the air cylinder 75 to lower only the third feed pin 71. Thus, only the third feed pin 71 of the feed pins 69 to 71 becomes engageable with the substrate 2. FIG. 17 illustrates a state in which the third feed pin 71 is in the lowered position. Unlike FIGS. 13A, 13B, 14A, 14B, 15A, 15B, 16A and 16B, FIGS. 17 and 18 illustrate only the substrate moving device 45.

Subsequently, the controller 34 opens the outlet door 41 and actuates the transfer motor 72. By opening the outlet door 41, the substrate 2 is allowed to be carried out of the transfer chamber 31A through the outlet opening 85. By actuating the transfer motor 72, the moving table 79 moves in the direction of arrow X1.

With the movement of the moving table 79, the third arm 68 moves in the direction of arrow X1 to cause the third feed pin 71 to engage with the substrate 2. As the moving table 79 moves further, the third feed pin 71 urges the substrate 2 to start moving in the direction of arrow X1. In this way, the substrate 2 leaves the substrate transfer stage 38 and is carried out of the transfer chamber 31A through the outlet opening 85. FIG. 18 illustrates a state in which the third feed pin 71 urges the substrate 2 to move in the direction of arrow X1.

As described above, the substrate transfer unit 35 transfers the substrate 2 from the substrate transfer stage 37 onto the substrate stage 36, from the substrate stage 36 onto the substrate transfer stage 38, and from the substrate transfer stage 38 to the outside of the transfer chamber 31A. These transfer operations are performed using the feed pins 69 to 71 selectively by moving the moving table 79 on which the three arms 66 to 68 having the feed pins 69 to 71 and air cylinders 74 to 76 are arranged as spaced apart from each other. By thus constructing the substrate transfer unit 35, it is possible to simplify the structure and shorten the distance to be traveled by the moving table 79, thereby to downsize the substrate transfer unit 35 and the transfer chamber 31A.

With reference to FIG. 19, description will be made of a method of applying the underfill material 6 to the substrate 2 by using the resin application apparatus 30 having the above-described configuration.

In FIG. 19, the uppermost section presents the internal pressure of the application chamber 31B; the second section next to the uppermost section presents process steps performed in the application chamber 31B; the third section presents process steps performed in the transfer chamber 31A; the fourth section presents changes in the internal pressure of the transfer chamber 31A; and the lowermost section presents changes in the temperature of the substrate 2.

In the sections of FIG. 19 which present the process steps performed in the transfer chamber 31A and the application chamber 31B, the process steps indicated by solid line are process steps performed for the second substrate 2 to which particular attention is paid here; the process steps indicated by dashed dotted line are process steps performed for the first substrate prior to the second substrate 2; and the process steps indicated by broken line are process steps performed for the third substrate 2 subsequently to the second substrate 2.

Reference characters A to H used in FIG. 19 represent the respective process steps performed in the chambers, and reference numerals 1 to 3 attached to these reference characters represent the first to third substrates sequentially subjected to the process. For example, "A2" represents the step of carrying the second substrate 2 to be subjected to the process into the transfer chamber 31A.

As described above, the resin application apparatus 30 used in the present embodiment includes the transfer chamber 31A and the application chamber 31B, which are configured to be capable of setting their respective internal pressures independently. The internal pressure of the application chamber 31B is constantly set to a low pressure irrespective of the internal pressure of the transfer chamber 31A. The "low pressure", as used herein, is meant by an internal pressure which allows the effect of the void 7 to be suppressed by contraction of the volume of the void 7 which occurs when the underfill material 6 having been applied under a low pressure environment is returned to an atmospheric pressure environment. (Specifically, such a low pressure ranges from 10 Pa to 1,000 Pa.)

The process illustrated in FIG. 19 starts with the step of applying the underfill material 6 to the first substrate (step D1). When the step of applying the underfill material 6 to the first substrate 2 (step D1) has been completed, the step of waiting for penetration of the underfill material 6 applied to the first substrate 2 (step E1) is performed.

Though the step of waiting for penetration of the underfill material 6 is included in the step of application of the underfill material 6 in a broad sense, FIG. 19 presents the application step and the penetration waiting step separately for the purpose of describing the process for application of the underfill material 6 more specifically.

The second substrate 2 is carried into the transfer chamber 31A in an atmospheric pressure condition (step A2). At that time, the step of application of the underfill material 6 (step D1) or the step of waiting for penetration of the underfill material 6 (step E1) is performed in the application chamber 31B for the first substrate which has been loaded on the resin application apparatus 30 prior to the process carried out for the second substrate 2.

The step of application of the underfill material 6 (step D1) and the step of waiting for penetration of the underfill material 6 (step E1) have to be performed under the low pressure environment. On the other hand, carrying the substrate 2 into the resin application apparatus 30 has to be performed under the atmospheric pressure environment. For this purpose, the resin application apparatus 30 is capable of providing the transfer chamber 31A and the application chamber 31B with different internal pressure environments. Therefore, the atmospheric pressure environment and the low pressure environment are provided in the transfer chamber 31A and the application chamber 31B, respectively.

Thus, it is possible to perform the step of carrying the second substrate 2 into the transfer chamber 31A (step A2) and the application step in the broad sense (including the step of application of the underfill material 6 (step D1) and the step of waiting for penetration of the underfill material 6 (step E1) for the first substrate 2) in parallel with each other at the same time. In the present embodiment, carrying the second substrate 2 into the transfer chamber 31A is performed during the step of waiting for penetration of the underfill material 6 (step E1). When the second substrate 2 has been carried into the transfer chamber 31A, the second substrate 2 is in a state of being held on the substrate transfer stage 37.

When the second substrate 2 has been carried into the transfer chamber 31A as described above, the controller 34 closes the inlet door 40 of the transfer chamber 31A and the valve 42A and actuates the vacuum pump 39A. In this way, the pressure reduction for the transfer chamber 31A starts to adjust the internal pressure of the transfer chamber 31A from atmospheric pressure to the low pressure described above. This pressure reduction is performed so that the predetermined low pressure is reached by the time the penetration waiting step (step E1 included in the application step in the broad sense) for the first substrate 2 is completed.

The substrate 2 is not transferred into the application chamber 31B until the internal pressure of the transfer chamber 31A becomes the low pressure and, hence, the substrate 2 stands by in the transfer chamber 31A (step B2). During the standby, the controller 34 actuates the air cylinder 61 to lift the hot plate 63 mounted on the substrate transfer stage 37 located in the transfer chamber 31A (see FIG. 9). By so doing, the hot plate 63 is brought into contact with the second substrate 2 to transfer heat generated by the heater 64 to the second substrate 2 there through. In this way, the second substrate 2 is heated.

The step of application of the underfill material 6 (step D2) and the step of waiting for penetration of the underfill material 6 (step E2), which will be described later, require that the substrate 2 be heated to a temperature that causes the resin forming the underfill material 6 to be imparted with fluidity (hereinafter will be referred to as "fluidizing temperature"). It has been a conventional practice to heat the substrate 2 after the substrate 2 has been loaded on the substrate stage 16 (see FIG. 3). For this reason, the temperature of the substrate 2 does not reach the fluidizing temperature at the time immediately after the start of application of the underfill material 6. Therefore, it has not been possible to perform proper application of the underfill material 6.

The present embodiment, by contrast, starts heating from step B2 during which the second substrate 2 stands by in the transfer chamber 31A. Therefore, the substrate 2 can be heated so that its temperature reaches the fluidizing temperature reliably at the time of the start of the step of application of the underfill material 6 (step D2) to be described later (see the section of FIG. 19 presenting changes in the temperature of the substrate 2).

When the application step for the first substrate 2 is completed while at the same time the predetermined low pressure environment is provided in the transfer chamber 31A, the controller 34 causes the transfer door 43 to open, so that communication is provided between the transfer chamber 31A and the application chamber 31B through the transfer opening 44a. However, since the inside of the transfer chamber 31A is in the low pressure environment by reduction in internal pressure, the internal pressure of the application chamber 31B fails to increase even when the chambers 31A and 31B communicate with each other.

When the communication has been provided between the chambers 31A and 31B as described above, the orthogonal robot 33 moves the substrate stage 36 holding the first substrate 2 having been applied with the underfill material 6 into the transfer chamber 31A through the transfer opening 44a. Then, the orthogonal robot 33 positions the substrate stage 36 in a space between the substrate transfer stages 37 and 38 (step F1).

Subsequently, the substrate moving device 45 of the above-described substrate transfer unit 35 is actuated to transfer the first substrate 2 held on the substrate stage 36 onto the substrate transfer stage 38. Thus, the first substrate 2 becomes held on the substrate transfer stage 38.

When the substrate stage 36 becomes free of the substrate by the transfer of the first substrate 2 onto the substrate transfer stage 38, the controller 34 then actuates the substrate moving device 45 to transfer the second substrate 2 held on the substrate transfer stage 37 onto the substrate stage 36. At that time, the controller 34 actuates the air cylinder 61 of the substrate transfer stage 37 to lower the hot plate 63 prior to step C2.

When the second substrate 2 becomes held on the substrate stage 36, the controller 34 actuates the orthogonal robot 33 to return the substrate stage 36 into the application chamber 31B and then causes the transfer door 43 to close (step C2). Thus, the transfer chamber 31A and the application chamber 31B are again air-tightly delimited from each other. With this state being maintained, the application nozzle 32 and the orthogonal robot 33 are actuated to apply the underfill material 6 between the second substrate 2 and the chip 3 mounted thereon (not illustrated) (step D2).

In performing step D2, the second substrate 2 is held on the substrate stage 36. In this step also, the controller 34 actuates the air cylinder 61 to lift the hot plate 63 of the substrate stage 36, thereby bringing the hot plate 63 into contact with the second substrate 2. Therefore, the second substrate 2 is maintained at the aforementioned fluidizing temperature by being heated by the heater 64 through the hot plate 63. Accordingly, the underfill material 6 delivered from the application nozzle 32 can be imparted with fluidity from the time immediately after the start of application, thereby ensuring favorable application.

When the step of applying the underfill material 6 to the second substrate 2 (step D2) starts in the application chamber 31B as described above, the controller 34 opens the valve 42A to start increasing the internal pressure of the transfer chamber 31A. By so doing, the internal pressure of the transfer chamber 31A is adjusted to atmospheric pressure.

When the internal pressure of the transfer chamber 31A increases to reach atmospheric pressure, the volume of the void 7 generated in the underfill material 6 applied to the substrate 2 is reduced to such an extent as to prevent migration from occurring, as described above.

During the pressure increase step, the first substrate 2 having been finished with application of the underfill material 6 is maintained in a state being held on the substrate transfer stage 38 (step G1). At that time, the hot plate 63 is maintained in the lowered position, so that the second substrate 2 fails to be heated by the heater 64.

When the internal pressure of the transfer chamber 31A has reached atmospheric pressure as described above, the controller 34 opens the outlet door 41 and then actuates the substrate moving device 45 to carry the first substrate 2 held on the substrate transfer stage 38 out of the transfer chamber 31A through the outlet opening 85 (step H1).

As described above, the present embodiment performs operation (A) of transferring the first substrate 2 having been finished with the application of the underfill material 6 in the application chamber 31B onto the substrate transfer stage 38 in the transfer chamber 31A and operation (B) of transferring the second substrate 2 held on the substrate transfer stage 37 in the transfer chamber 31A into the application chamber 31B, with communication provided between the chambers 31A and 31B both provided with the low pressure environment through the transfer opening 44a by opening the transfer door 43. Therefore, the present embodiment is capable of performing the above-described operations (A) and (B) continuously and hence makes it possible to shorten the tact time as compared with the conventional application method which requires increasing and reducing the internal pressure of the reduced pressure chamber 11 between the operations (A) and (B).

Reducing the internal pressure of the transfer chamber 31A for transferring the second substrate 2 into the application chamber 31B is performed during the application step (including steps D1 and E1) for the first substrate 2 in the application chamber 31B. Likewise, increasing the internal pressure of the transfer chamber 31A for carrying the first substrate 2 finished with the application from the transfer chamber 31A to the outside is performed during the application step (step D2) for the second substrate 2 in the application chamber 31B.

Thus, the present embodiment is capable of performing the internal pressure adjustment (pressure reduction and increase) for the transfer chamber 31A separately from and in parallel with the substrate processing in the application chamber 31B. Therefore, this feature can also shorten the time required for the internal pressure adjustment as compared with the conventional configuration having only one reduced pressure chamber 11 in the resin application apparatus 10, thereby making it possible to shorten the tact time.

At the time when the first substrate 2 finished with the application has been carried out of the transfer chamber 31A as described above, the inside of the transfer chamber 31A is under the atmospheric pressure environment, while the substrate transfer stage 37 is free of the substrate 2. Accordingly, after the step of carrying the first substrate 2 out of the transfer chamber 31A (step H1) has been completed, the controller 34 causes the substrate transfer stage 37 to carry the third substrate 2 to be subjected the process subsequently to the second substrate 2 into the transfer chamber 31A (step A3).

In the step of carrying the third substrate 2 into the transfer chamber 31A (step A3), the controller 34 initially opens the inlet door 40 and, then, the substrate 2 is loaded on the substrate transfer stage 37 through the inlet opening 84 by a transfer robot (not illustrated) provided outside the resin application apparatus 30. When this loading has been completed, the inlet door 40 is closed to turn the transfer chamber 31A into the air-tight condition again.

Carrying the third substrate 2 into the transfer chamber 31A is performed during the application step for the second substrate 2 in the broad sense (i.e., during the application step (step D2) or the penetration waiting step (step E2)). In the present embodiment, carrying the third substrate 2 into the transfer chamber 31A is performed during the step of waiting for penetration of the underfill material 6 for the second substrate 2 (step E2).

When the third substrate 2 has been carried into the transfer chamber 31A as described above, the controller 34 closes the valve 42A and actuates the vacuum pump 39A. Thus, the pressure reduction for the transfer chamber 31A is started to adjust the internal pressure of the transfer chamber 31A from atmospheric pressure to the above-described low pressure.

This pressure reduction is performed so that the predetermined low pressure is reached by the time the penetration waiting step (step E1 included in the application step in the broad sense) is completed for the second substrate 2.

The third substrate 2 is not transferred to the application chamber 31B until the internal pressure of the transfer chamber 31A becomes the low pressure and, hence, the substrate 2 stands by in the transfer chamber 31A (step B3). During the standby, the controller 34 causes the hot plate 63 mounted on the substrate transfer stage 37 to be lifted, thereby heating the third substrate 2 by the heater 64 and the hot plate 63. In the same manner as with the second substrate 2, the temperature of the third substrate 2 has reached the fluidizing temperature at the time of the start of the application step (step D3) and, hence, proper application of the underfill material 6 can be performed from the time immediately after the start of application.

When the application step for the first substrate 2 is completed while at the same time the predetermined low pressure environment is provided in the transfer chamber 31A, the controller 34 causes the transfer door 43 to open, so that communication is provided between the transfer chamber 31A and the application chamber 31B through the transfer opening 44a. Subsequently, the orthogonal robot 33 moves the substrate stage 36 holding the second substrate 2 having been applied with the underfill material 6 into the transfer chamber 31A and then positions the substrate stage 36 in the space between the substrate transfer stages 37 and 38 (step F2).

Subsequently, the controller 34 actuates the substrate moving device 45 to transfer the second substrate 2 held on the substrate stage 36 onto the substrate transfer stage 38. Thus, the second substrate 2 becomes held on the substrate transfer stage 38.

When the substrate stage 36 becomes free of the substrate by the transfer of the second substrate 2 onto the substrate transfer stage 38, the controller 34 actuates the substrate moving device 45 to transfer the third substrate 2 held on the substrate transfer stage 37 onto the substrate stage 36. When the second substrate 2 becomes held on the substrate stage 36, the controller 34 actuates the orthogonal robot 33 to return the substrate stage 36 into the application chamber 31B and then causes the transfer door 43 to close (step C3).

Thus, the transfer chamber 31A and the application chamber 31B are again air-tightly delimited from each other. With this state being maintained, the application nozzle 32 and the orthogonal robot 33 are actuated to apply the underfill material 6 between the third substrate 2 and the chip 3 mounted thereon (not illustrated) (step D3).

In performing step D3, the third substrate 2 is held on the substrate stage 36. In this step also, the controller 34 actuates the air cylinder 61 to lift the hot plate 63 of the substrate stage 36, thereby bringing the hot plate 63 into contact with the third substrate 2. Therefore, like the above-described second substrate 2, the third substrate 2 is maintained at the aforementioned fluidizing temperature. Thus, reliable application can be performed from the time immediately after the start of application of the underfill material 6.

When the step of applying the underfill material 6 to the third substrate 2 (step D3) starts in the application chamber 31B as described above, the controller 34 opens the valve 42A to start increasing the internal pressure of the transfer chamber 31A. By so doing, the internal pressure of the transfer chamber 31A is adjusted to atmospheric pressure (i.e., the step of adjustment to the second internal pressure). During the pressure increase, the second substrate 2 having been finished with application of the underfill material 6 is maintained in a state being held on the substrate transfer stage 38 (step G2).

When the internal pressure of the transfer chamber 31A increases to reach atmospheric pressure, the volume of the void 7 generated in the underfill material 6 is reduced to such an extent as to prevent migration from occurring, as described above. When the internal pressure of the transfer chamber 31A has reached atmospheric pressure, the controller 34 opens the outlet door 41 and then actuates the substrate moving device 45 to carry the second substrate 2 held on the substrate transfer stage 38 out of the transfer chamber 31A through the outlet opening 85 (step H2).

With respect to the second substrate 2 also, the operation (A) of transferring the second substrate 2 having been finished with the application of the underfill material 6 in the application chamber 31B onto the substrate transfer stage 38 in the transfer chamber 31A and the operation (B) of transferring the third substrate 2 held on the substrate transfer stage 37 in the transfer chamber 31A into the application chamber 31B, are performed between the chambers 31A and 31B both provided with the low pressure environment. Therefore, it is possible to perform the operations (A) and (B) continuously, thereby to shorten the tact time.

The application method according to the present embodiment performs the two steps, i.e., pressure increasing step (C) for carrying the first substrate 2 out of the transfer chamber 31A and pressure reducing step (D) for carrying the third substrate 2 into the application chamber 31B, while performing the step of applying the underfill material 6 to the second substrate (step D2) and the penetration waiting step (step E2), that is, before the completion of the application step in the broad sense for the second substrate 2. Thus, in cases where the underfill material 6 is applied to the equal number of substrates 2, it is possible to reduce the number of required times of the pressure increasing step and pressure reducing step as compared with the conventional application method. This feature can also shorten the tact time.

Further, since the chamber used in the present embodiment is partitioned into the transfer chamber 31A and the application chamber 31B, the capacity of the transfer chamber 31A can be reduced as compared with that of the conventional reduced pressure chamber 11 (see FIG. 3). For this reason, when the vacuum pump 39A having the same output power as the vacuum pump used for the conventional chamber, it is possible to shorten the time required to complete the pressure increasing step and the pressure reducing step as compared with the conventional art. This feature can also shorten the tact time.

Figure 20:
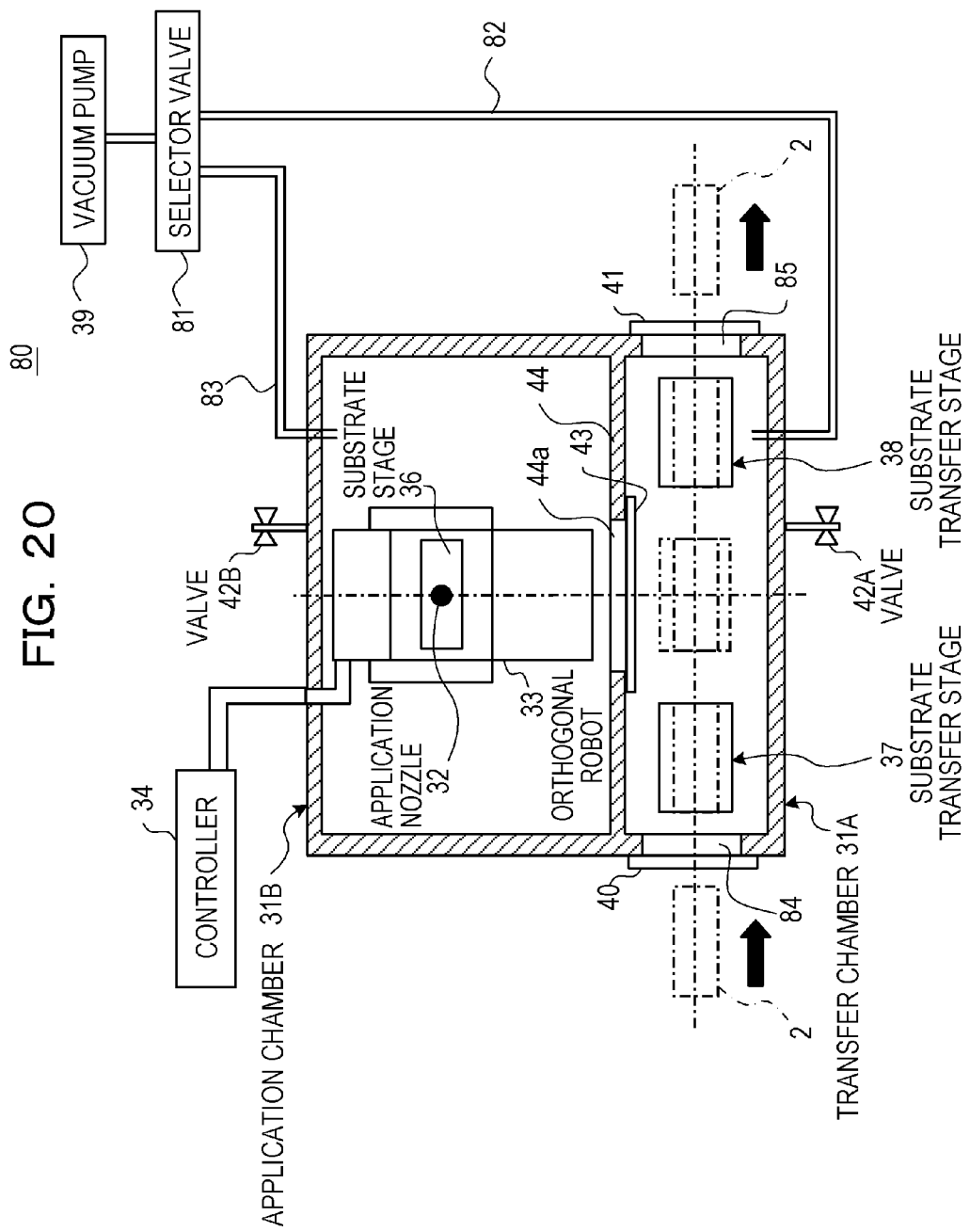
FIG. 20 illustrates a variation of the resin application apparatus.

FIG. 20 illustrates a resin application apparatus 80 as a variation of the resin application apparatus 30 illustrated in FIG. 5. Like reference characters are used to designate like or corresponding parts throughout FIGS. 5 and 20 in order to omit description thereof.

The resin application apparatus 30 illustrated in FIG. 5 has a configuration wherein the vacuum pump 39A for reducing the internal pressure of the transfer chamber 31A and the vacuum pump 39B for reducing the internal pressure of the application chamber 31B are provided separately. By contrast, the resin application apparatus 80 according to this variation is configured to be capable of reducing the internal pressures of both of the transfer chamber 31A and the application chamber 31B by using a single vacuum pump 39.

The vacuum pump 39 is connected to the chambers 31A and 31B via a selector valve 81. Specifically, the selector valve 81 is connected to the transfer chamber 31A via a vacuum pipe 82 and to the application chamber 31B via a vacuum pipe 83. The selector valve 81 is connected to the controller 34. Thus, the selector valve 81 is controlled by the controller 34 to selectively establish connection between the vacuum pump 39 and the chamber 31A or connection between the vacuum pump 39 and the chamber 31B.

As described above, the present variation is provided with the only one vacuum pump 39 having a large size for adjusting the internal pressures of the respective chambers 31A and 31B. For this reason, the resin application apparatus 80 can be reduced in size. Further, since the selector valve 81 is used in reducing the internal pressure of the transfer chamber 31A, switching to the pressure reduction is possible with the substrate transfer stage 38 previously actuated. For this reason, the present variation can offer enhanced responsiveness as compared with the configuration in which the vacuum pump 39A is actuated at the time of the start of the pressure reduction.

Each of the foregoing embodiments illustrated above has the configuration wherein: the semiconductor device comprising the substrate 2 and the chip 3 mounted thereon by flip chip bonding is used as the object to be applied with the underfill material 6 by the resin application apparatus 30 (80); and the underfill material 6 is applied between the substrate 2 and the chip 3, as illustrated in FIG. 1A. However, applications of the present invention are not limited to such a configuration, but the present invention is applicable to cases where a resin is applied to a semiconductor element mounted on a substrate.

Figure 21:
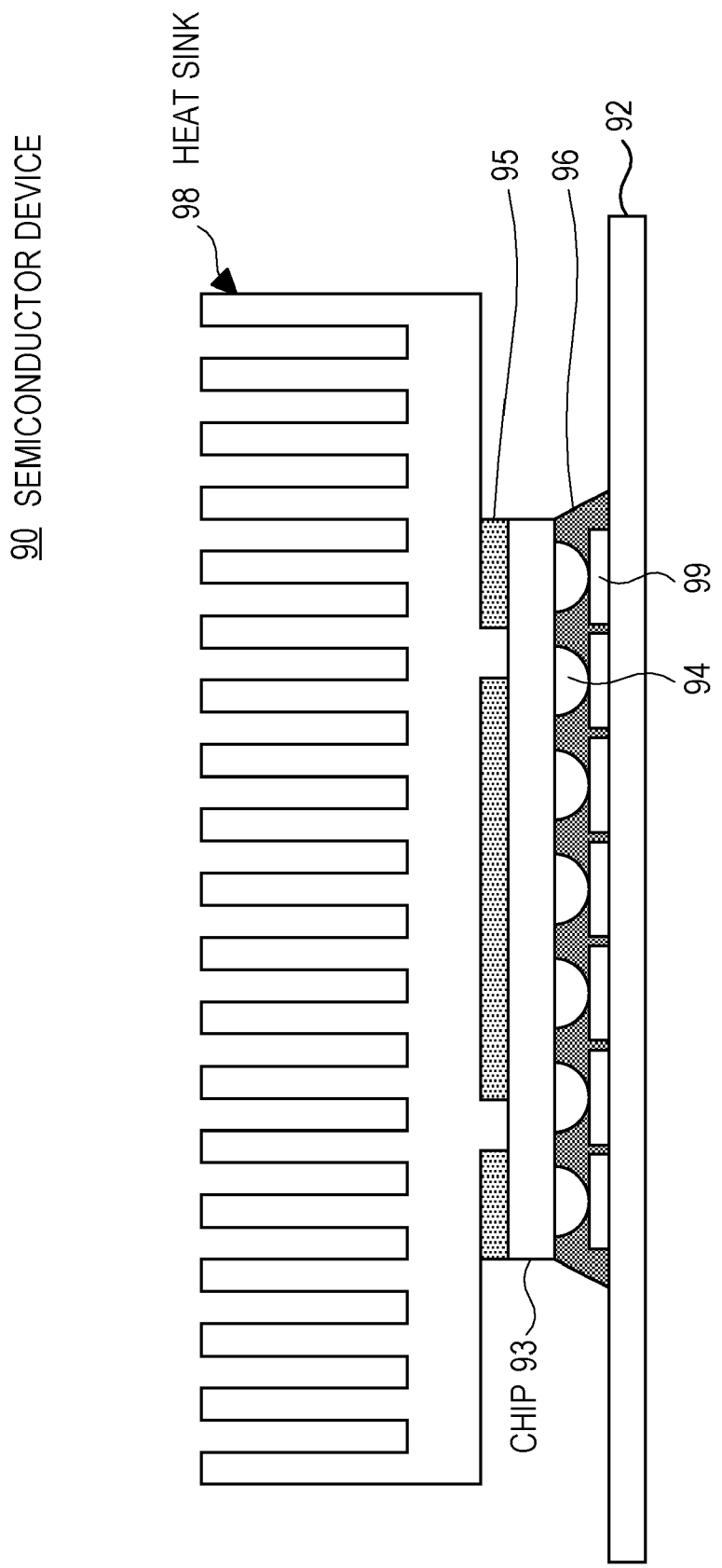
FIG. 21 illustrates another semiconductor device to which the present invention is applicable.

FIG. 21 illustrates a semiconductor device 90 including a substrate 92 and a chip 93 (i.e., semiconductor element) mounted thereon. The chip 93 and the substrate 92 are electrically connected to each other by connecting bumps 94 to respective electrode pads 99. The semiconductor device 90 further includes resin 95 applied on top of the chip 93 and a heat sink 98 fixed to the chip 93 by means of the resin 95. The resin 95 is applied by the resin application apparatus 30 (80) in accordance with the foregoing application method. Thus, the resin application apparatus 30 (80) and application method according to the present embodiment are also applicable to cases where the resin 95 is to be applied (or filled) between the heat sink 98 and the chip 93.

The semiconductor device 90 illustrated in FIG. 21 is applied (or filled) with an underfill material 96 between the substrate 92 and the chip 93. The resin application apparatus 30 (80) according to the present embodiment is also applicable to the application of the underfill material 96.

Applications of the present invention are not limited only to the structure having a semiconductor element mounted on a substrate. The present invention is widely applicable to electronic components other than semiconductor elements. Specifically, the resin application apparatus 30 (80) according to the present embodiment is also applicable to cases where an electronic component, such as an antenna, a sensor, or a switch, is to be coated with resin. In such cases, various types of substrates, such as a printed board, a ceramic substrate, and a flexible board, may be used as the substrate 2 without particular limitation.

It is needless to say that applications of the present invention are not limited to cases where a single electronic component or semiconductor element (chip) is mounted on a substrate, but the present invention is applicable to cases where a plurality of such electronic components or semiconductor elements are mounted on a substrate.

According to the present invention, it is possible to suppress the generation of a void in resin and shorten the time required for application of the resin.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that various changes, substitutions, and alterations could be made hereto without departing from the spirit and scope of the invention.

The invention claimed is:

1. An application method for resin comprising:
    applying resin to a first electronic component in an application chamber under a first internal pressure;
    moving a second electronic component into an internal pressure adjustment chamber under a second internal pressure which is higher than the first internal pressure;
    reducing an internal pressure of the internal pressure adjustment chamber storing the second electronic component from the second internal pressure to the first internal pressure by a vacuum pump connected the internal pressure adjustment chamber;
    moving the second electronic component into the application chamber while moving the first electronic component into the internal pressure adjustment chamber after the step of application of the resin has been completed; and
    applying resin to the second electronic component in the application chamber under the first internal pressure.

2. The application method for resin according to claim 1 further comprising:
    adjusting the internal pressure of the pressure adjustment chamber to the second internal pressure during application of the resin to the second electronic component; and
    moving a third electronic component into the internal pressure adjustment chamber while moving the first electronic component out of the internal pressure adjustment chamber during the application of the resin to the second electronic component.

3. The application method for resin according to claim 1, wherein the second electronic component is heated in the step of adjusting the internal pressure of the internal pressure adjustment chamber to the first internal pressure.

4. The application method for resin according to claim 2, wherein the first, second and third electronic components are each a substrate unit comprising at least one electronic component mounted on a printed board, while the resin is applied to the electronic component.

5. The application method for resin according to claim 2, wherein the first, second and third electronic components are each a semiconductor component comprising at least one semiconductor element mounted on a substrate, and the resin is applied to the semiconductor element.

6. The application method for resin according to claim 2, wherein the first, second and third electronic components are each a semiconductor component comprising at least one semiconductor element mounted on a substrate, and the resin is applied between the semiconductor element and the substrate.

* * * * *